(12) United States Patent
Kitagawa

(10) Patent No.: US 7,558,134 B2
(45) Date of Patent: Jul. 7, 2009

(54) SEMICONDUCTOR MEMORY DEVICE AND ITS OPERATION METHOD

(75) Inventor: Makoto Kitagawa, Kanagawa (JP)

(73) Assignee: Sony Corporation (JP)

( * ) Notice: Subject to any disclaimer, the term of this patent is extended or adjusted under 35 U.S.C. 154(b) by 225 days.

(21) Appl. No.: 11/715,413

(22) Filed: Mar. 8, 2007

(65) Prior Publication Data

US 2007/0217260 A1  Sep. 20, 2007

(30) Foreign Application Priority Data

Mar. 20, 2006  (JP)  ............... 2006-076928

(51) Int. Cl.
*G11C 7/00* (2006.01)
(52) U.S. Cl. ............. 365/196; 365/189.15; 365/149
(58) Field of Classification Search ........... 365/189.14, 365/196, 207, 149
See application file for complete search history.

(56) References Cited

U.S. PATENT DOCUMENTS 6,809,979 B1 * 10/2004 Tang ..................... 365/222

2005/0162894 A1 * 7/2005 Itoh et al. .................... 365/149
2006/0227648 A1 * 10/2006 Kameshiro et al. ..... 365/230.05

FOREIGN PATENT DOCUMENTS

JP  2001-291389  10/2001

* cited by examiner

*Primary Examiner*—Vu A Le
*Assistant Examiner*—Han Yang
(74) *Attorney, Agent, or Firm*—Rader Fishman & Grauer PLLC; Ronald P. Kananen

(57) ABSTRACT

A semiconductor memory device includes a memory-cell array, a read bit line, a write bit line, a sense amplifier, a first sense line, a second sense line, a first bit line switch, and a second bit line switch. The memory-cell array is laid out to form an array. The read bit line is shared by plural memory cells and connected to a data output node. The write bit line is shared by plural memory cells and connected to a data input node. The sense amplifier is configured to sense a difference in electric potential. The first sense line is connected to one of the input terminals. The second sense line is connected to the other input terminal. The first bit line switch is configured to control electrical connection and disconnection. The second bit line switch is configured to control electrical connection and disconnection.

11 Claims, 22 Drawing Sheets

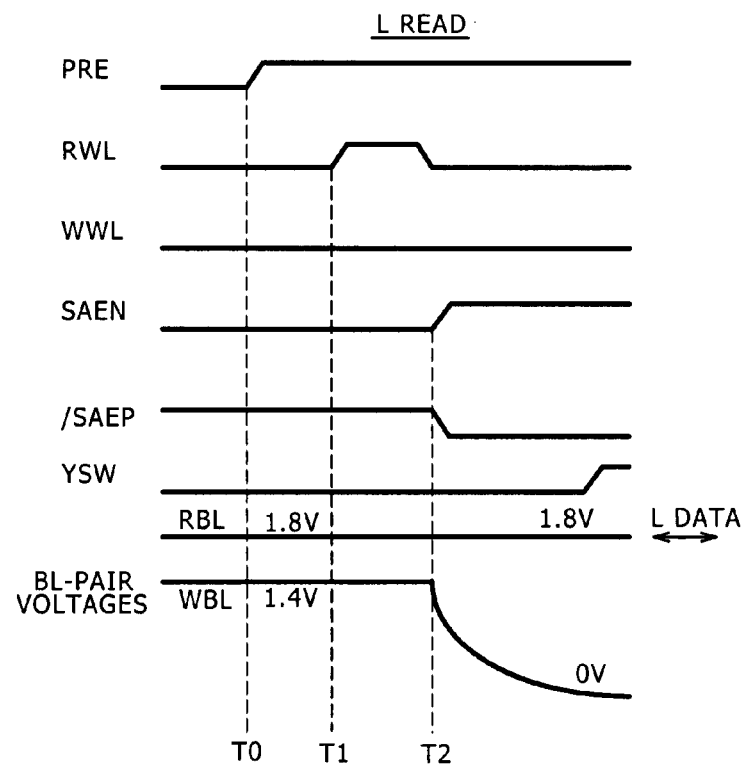
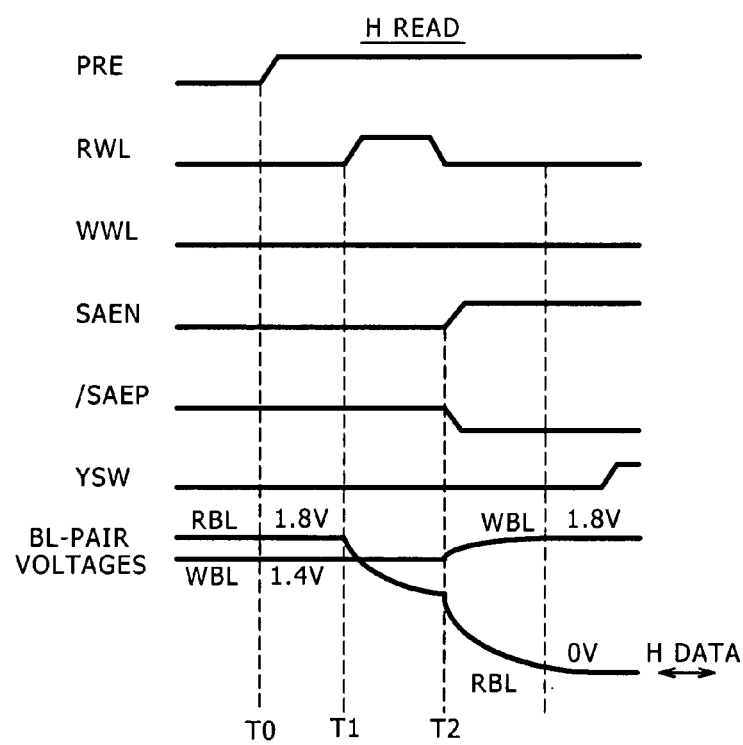

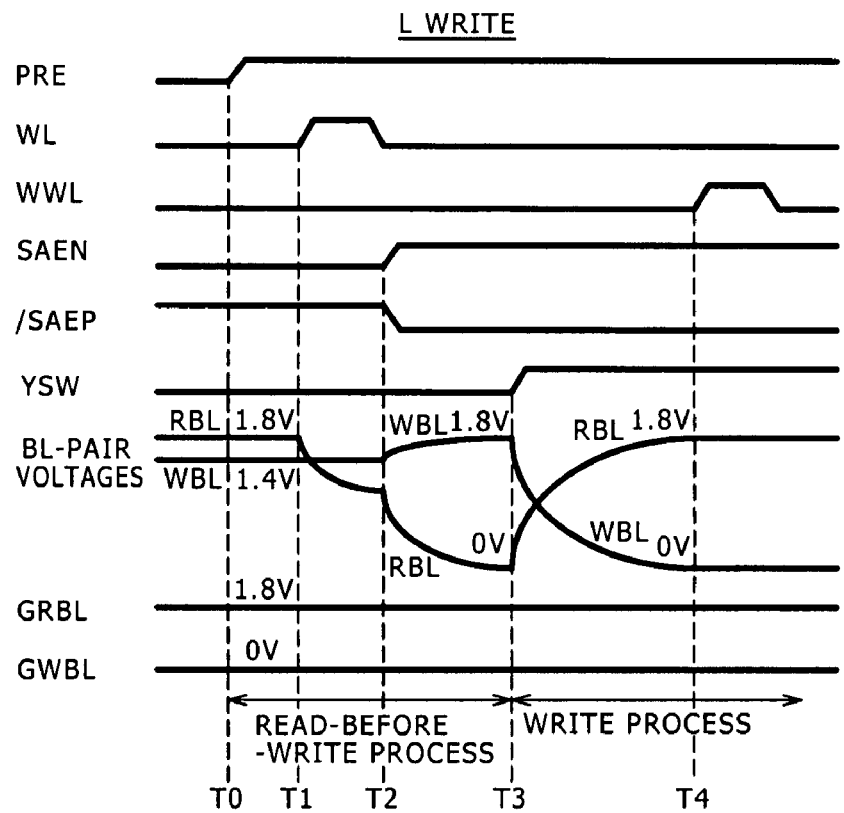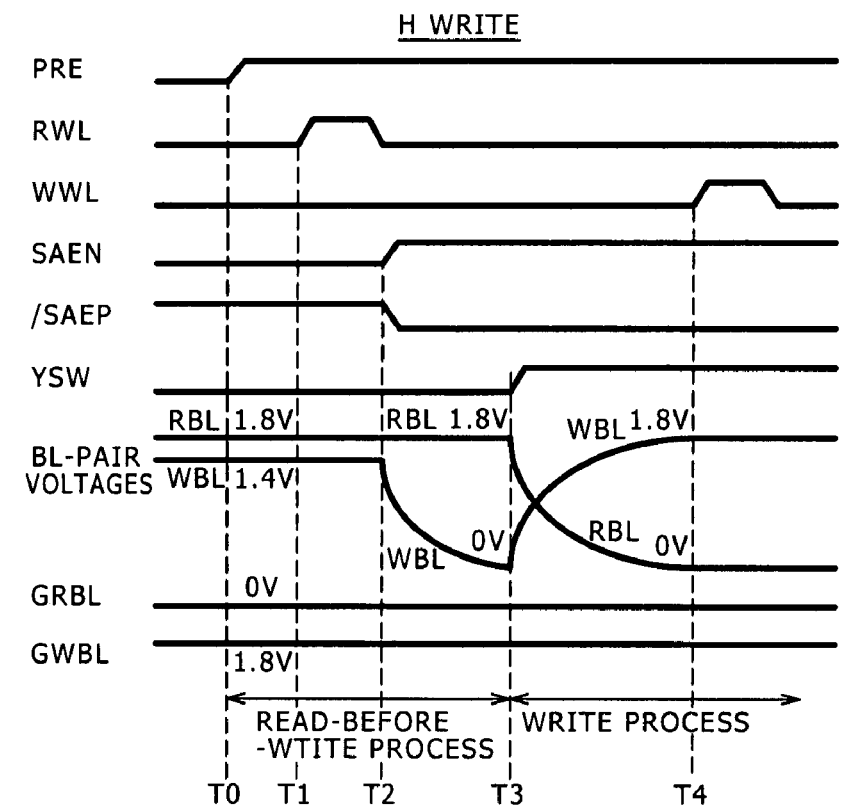

FIG. 16
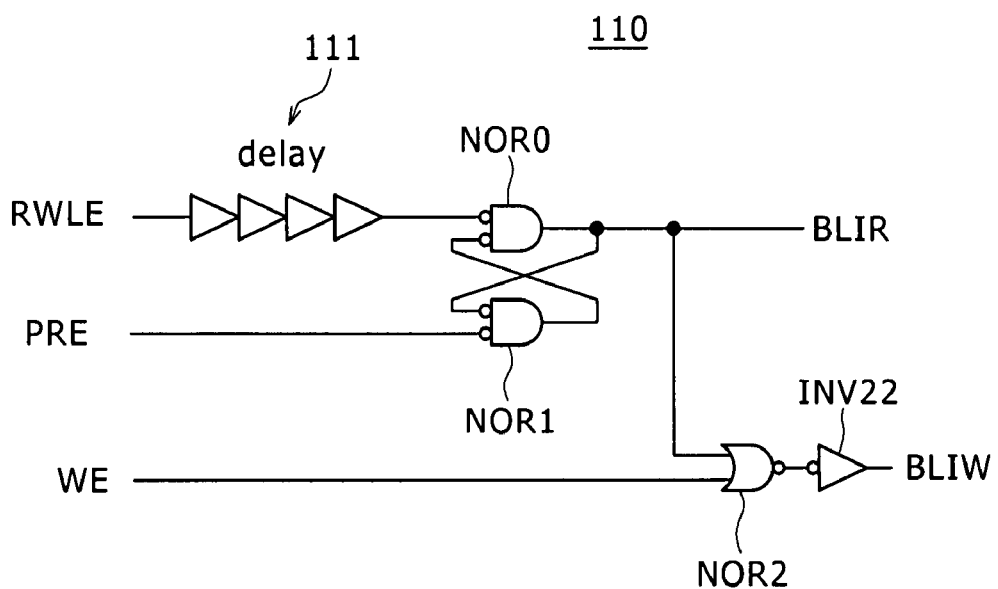
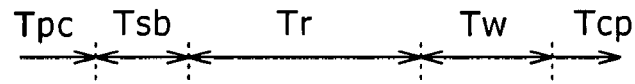
FIG. 17A  PRE
FIG. 17B  RWLE
FIG. 17C  WE
FIG. 17D  BLIR
FIG. 17E  BLIW

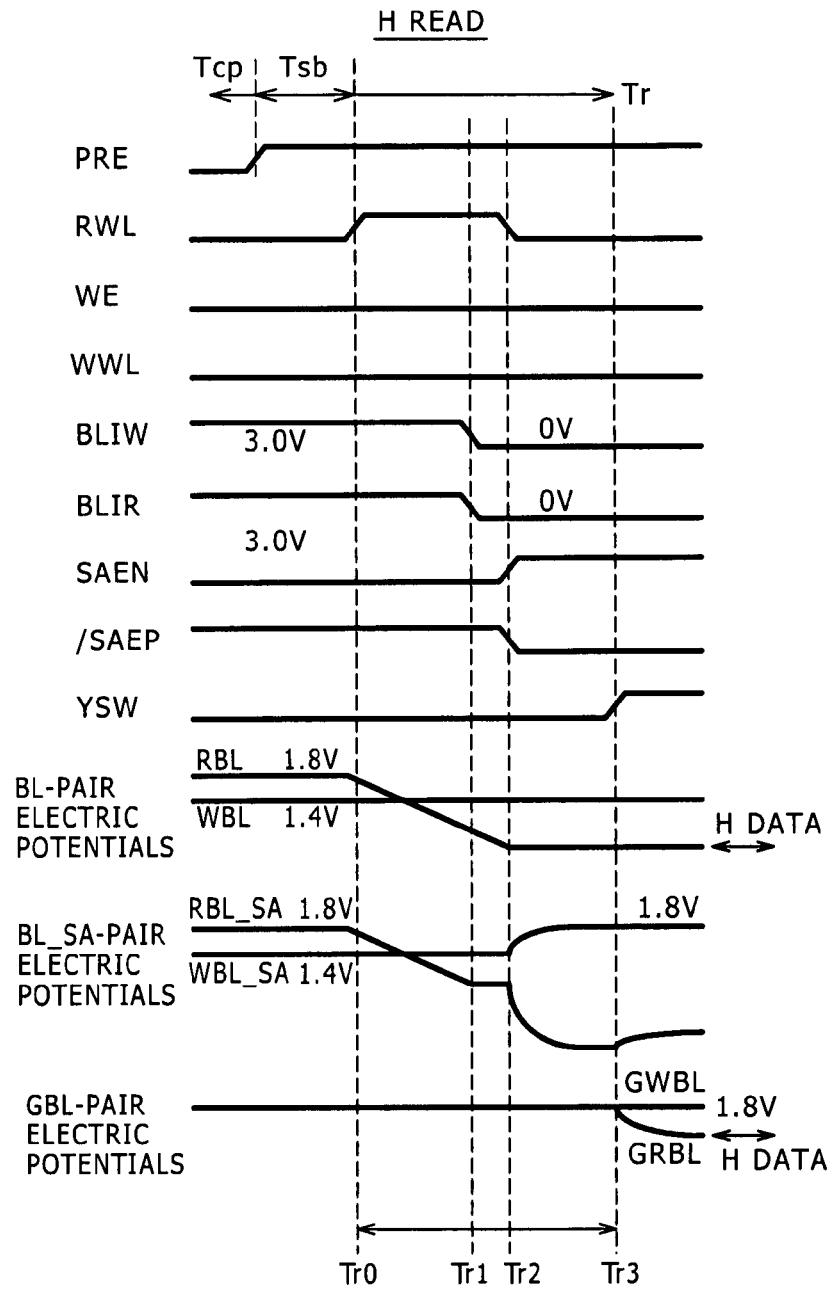

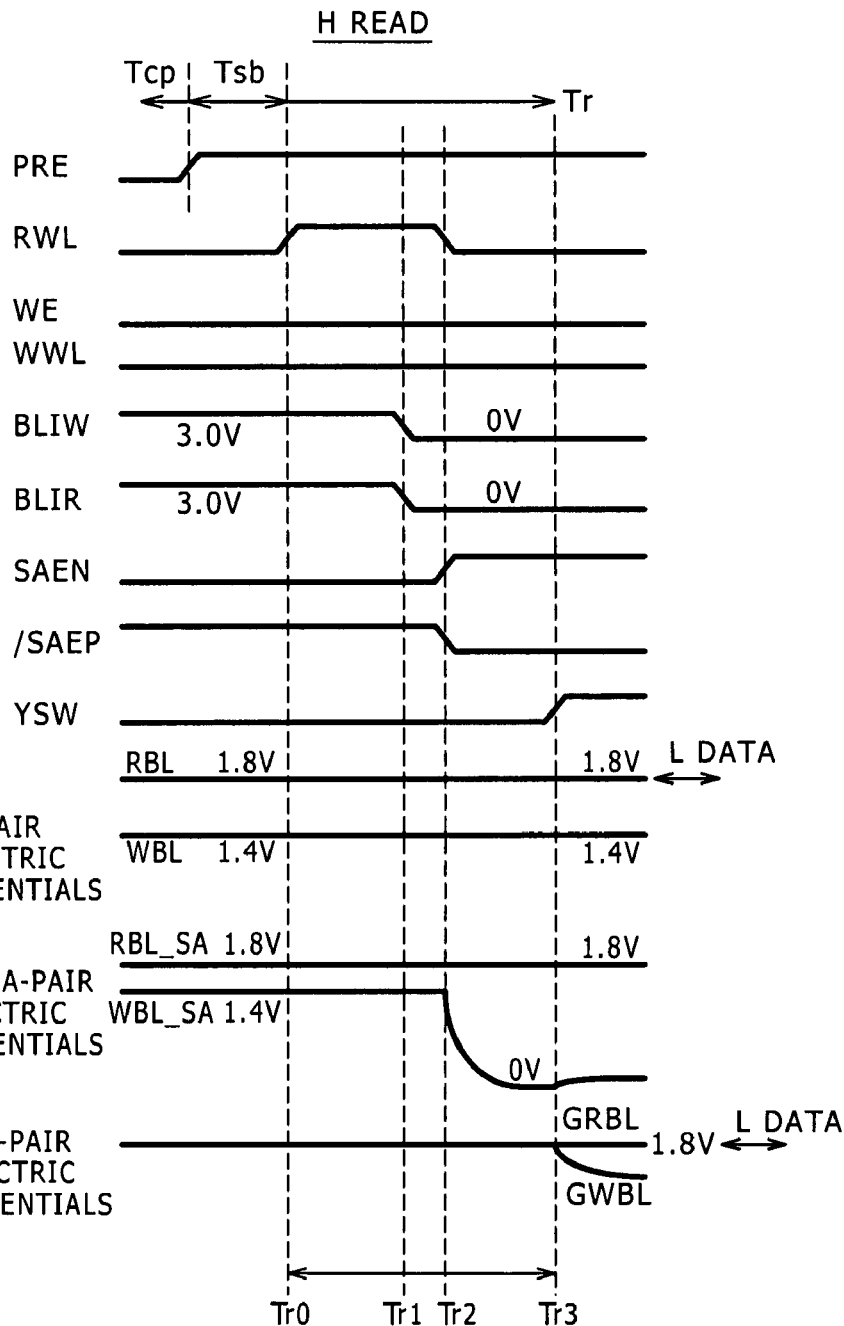

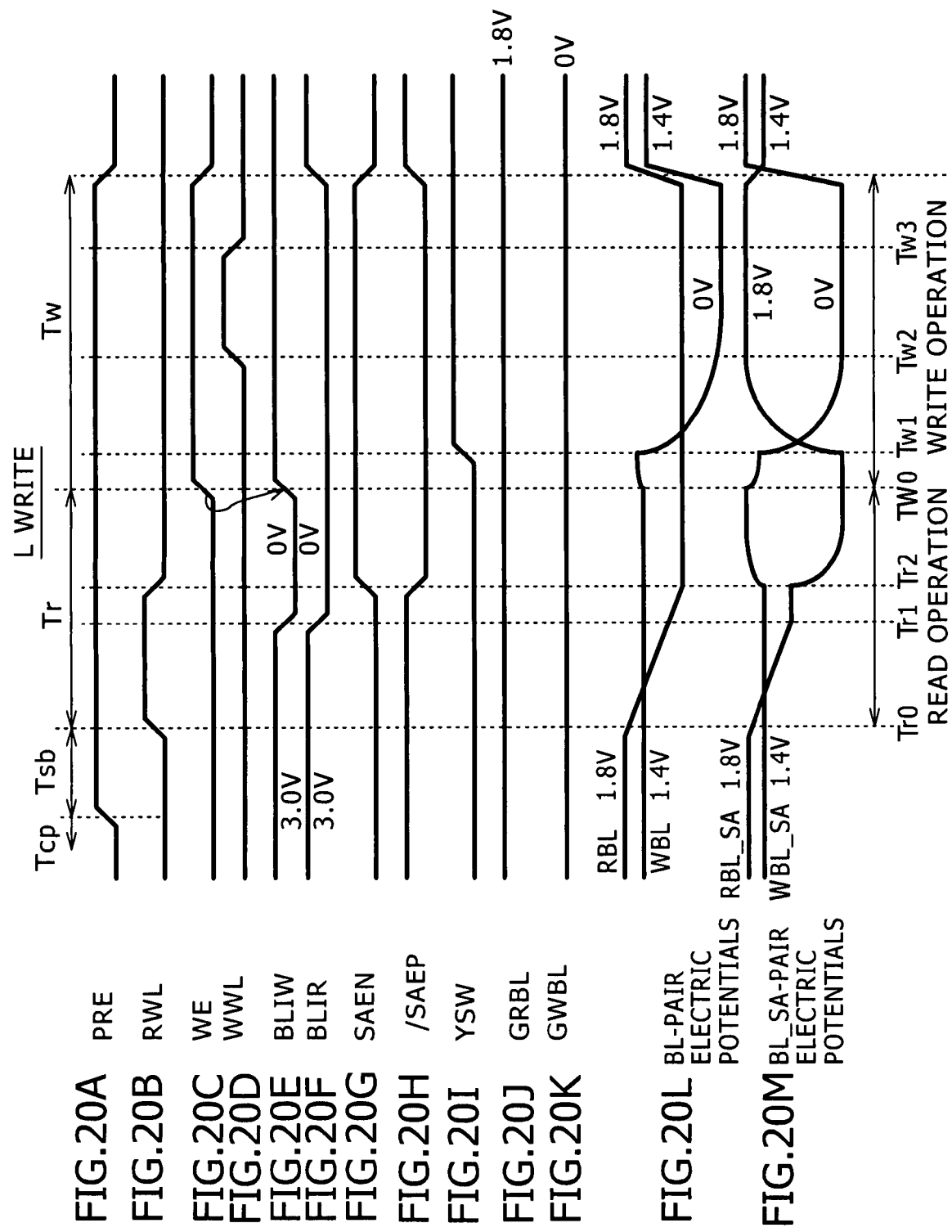

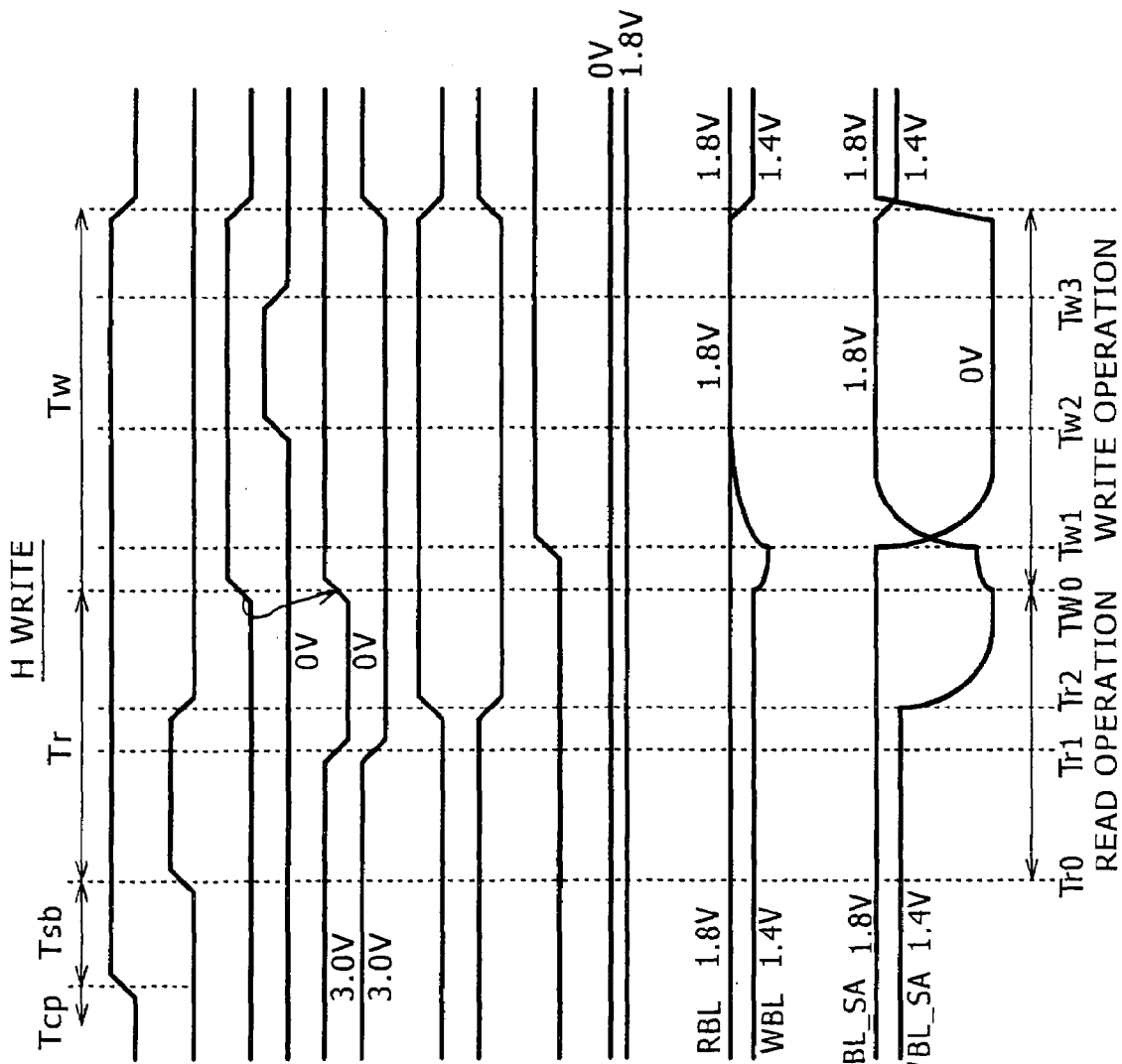

SEMICONDUCTOR MEMORY DEVICE AND ITS OPERATION METHOD

CROSS REFERENCES TO RELATED APPLICATIONS

The present invention contains subject matter related to Japanese Patent Application JP 2006-076928 filed with the Japanese Patent Office on Mar. 20, 2006, the entire contents of which being incorporated herein by reference.

BACKGROUND OF THE INVENTION

1. Field of the Invention

The present invention relates to a semiconductor memory device and its operation method. The semiconductor memory device includes a memory cell having a data input node connected a write bit line and a data output node connected to a read bit line and also includes a sensor for sensing a difference in voltage between the write bit and read bit lines.

2. Description of the Related Art

The so-called gain cell is known as the memory cell having a data input node connected a write bit line and a data output node connected to a read bit line as described above. The gain cell is a memory cell, which has an amplification transistor for storing data by isolation signal BLIW are at the H level of 3.0 V whereas the read bit line RBL and the write bit line WBL are electrically connected to the RBL sense line RBL_SA and the WBL sense line WBL_SA respectively. Thus, the read bit line RBL and the RBL sense line RBL_SA are set at the same electric potential whereas the write bit line WBL and the WBL sense line WBL_SA are set at the same electric potential.

At that time, the Y switch signal YSW is at an L level as shown in FIG. 18I. This is because, since the Y-switch enable signal YSWE supplied to the nand circuit NAND14 shown in FIG. 14 is at an L level defined for an inactive state, the output of the nand circuit NAND14 is raised to an H level, pulling down the Y switch signal YSW to an L level. Thus, during the pre-charge period Tpc, the bit-line pair RBL-WBL and the sense-line pair RBL_SA-WBL_SA are electrically isolated from the global bit line pair GRBL-GWBL shown in FIG. 10, being put in a floating state.

When the RWL enable signal RWLE shown in FIG. 17B is raised to an H level, activating the read word line RWL shown in FIG. 18B, typically, a pulse of the power-supply voltage Vdd is applied. Thus, the select transistor ST shown in FIG. 1 is turned on. At that time, holding electric charge in a capacitive component added to the gate of the transistor, and allows the stored data to be read out from the capacitive component by converting the data into a change in the voltage appearing on the read bit line in accordance with whether the amplification transistor is at an on or off state at the read time dependently on the amount of the electric charge held in the capacitive component.

FIG. 1 is a diagram showing an equivalent circuit of a 3T (three transistors) gain cell, which is referred to hereafter simply as a memory cell MCa. The memory cell MCa shown in the figure has a write transistor WT and two read transistors, which are a select transistor ST and an amplification transistor AT.

One of the source and drain of the write transistor WT is connected to a write bit line WBL and the other is connected to a storage node SN. On the other hand, the gate of the write transistor WT is connected to a write word line WWL.

The source of the amplification transistor AT is connected to a CSL (common source line) serving as the ground and the drain of the amplification transistor AT is connected to the source of the select transistor ST. On the other hand, the gate of the amplification transistor AT is connected to the storage node SN.

The drain of the select transistor ST is connected to a read bit line RBL and the gate of the select transistor ST is connected to a read word line RWL.

FIG. 2 is a diagram showing a typical memory-cell system circuit.

As shown in FIG. 2, a plurality of memory cells MCa each shown in FIG. 1 are arranged in the column direction. The memory cells MCa share the read bit line RBL and the write bit line WRL, which form a pair of lines.

The pair of lines composing of the read bit line RBL and the write bit line WBL is connected to a pre-charge circuit 50 having two pre-charge transistors PTr and PTw, which are each a PMOS transistor. The drain of the pre-charge transistor PTr is connected to the read bit line RBL and the source of the pre-charge transistor PTr is connected to a supply line for supplying a voltage VRBL. On the other hand, the drain of the pre-charge transistor PTw is connected to the write bit line WBL and the source of the pre-charge transistor PTw is connected to a supply line for supplying a voltage VWBL. The two pre-charge transistors PTr and PTw are controlled by a common pre-charge enable line PRE.

The pair of lines composing of the read bit line RBL and the write bit line WBL is further connected to a cross couple latch sense amplifier, which is referred to hereafter simply as an SA (Sense Amplifier).

As shown in the figure, the sense amplifier SA includes two inverters, which are wired in cross connection, that is, the input of a specific one of the inverters is connected to the output of the other inverter and the output of the specific inverter is connected to the input of the other inverter. Each of the inverters includes a PMOS transistor 21 and an NMOS transistor 22.

A PMOS transistor 23 controlled by an SA enable inverted signal /SAEP, which is an active low signal, is connected to a junction point between a source common to the two PMOS transistors 21, 22 and a power-supply voltage line. On the other hand, an NMOS transistor 24 controlled by an SA enable signal SAEN, which is an active high signal, is connected to a junction point between a source common to the two NMOS transistors 22 and the ground line. The SA enable inverted signal /SAEP and the SA enable signal SAEN are each shared by other sensor amplifiers SA laid out in the row direction. It is to be noted, however, that the other sensor amplifiers SA are not shown in the figure.

The memory-cell control system circuit having the cross couple latch sense amplifier SA is described in documents such as Japanese Patent Laid-open No. 2001-291389.

A BL selector 6B is a circuit electrically disconnecting the read bit line RBL and the write bit line WBL, which are connected to the pre-charge circuit 50 and the sense amplifier SA, from other control circuits.

The BL selector 6B includes an NMOS switch 61r and an NMOS switch 61w. The NMOS switch 61r is connected between the read bit line RBL and a global read bit line GRBL. On the other hand, the NMOS switch 61w is connected between the write bit line WBL and a global write bit line GWBL.

FIGS. 3A to 3G are timing charts for operations to read out L data from the storage node SN. During the read operations, the write word line WWL is set at a low level indicating an inactive state all the time as shown in FIG. 3C.

As shown in FIG. 3A, an active-low pre-charge enable signal PRE is at an L level during a period of time ending at a time T0. Thus, during the period of time, the two pre-charge transistors PTr and PTw shown in FIG. 2 are both in an on state. As a result, the read bit line RBL is set (or pre-charged) at a voltage VRBL and the write bit line WBL is set (or pre-charged) at a voltage VWBL lower than the voltage VRBL. Typically, the voltage VRBL is the power-supply voltage Vdd (=1.8 V). On the other hand, the voltage VWBL is typically 1.4 V. At the time T0, the pre-charge enable signal PRE is set in an inactive state by raising the pre-charge enable signal PRE to an H level to set the read bit line RBL and the write bit line WBL in a floating state holding the pre-charge voltages as they are.

At a time T1, the read word line RWL is set at an H level by typically applying a pulse of the power-supply voltage Vdd as shown in FIG. 3B. Thus, the select transistor ST shown in FIG. 1 or 2 is turned on. Since the voltage appearing at the storage node SN is at an L level, however, the amplification transistor AT stays in the off state as it is. Thus, the read bit line RBL also remains at the power-supply voltage Vdd (=1.8 V) as it is.

At a time T2, the SA enable signal SAEN is raised to an H level in order to put the signal in an active state as shown in FIG. 3D. On the other hand, at the same time T2, the SA enable inverted signal /SAEP is pulled down to an L level also in order to put the signal in an active state as shown in FIG. 3E. Thus, the sense amplifier SA shown in FIG. 2 operates, amplifying a small electric-potential difference of about 0.4 V between the voltage appearing on the read bit line RBL and the voltage appearing on the write bit line WBL to a signal with an amplitude of 1.8 V. The state in which the voltage appearing on the read bit line RBL is higher than the voltage appearing on the write bit line WBL corresponds to the L data in the memory cell MCa.

Then, a Y-switch signal YSW shown in FIG. 3F is raised to an H level in order to turn on the NMOS switch 61r and the NMOS switch 61w, which are employed in the BL selector 6B as shown in FIG. 2, so as to supply the L data read out from the storage node SN to a control circuit provided at the following stage.

FIGS. 4A to 4G are timing charts for operations to read out H data from the storage node SN. Control of voltage levels in the operations to read out H data from the storage node SN as shown in FIGS. 4A to 4F is the same as that of the L-data read operations described above except that, during the operations to read out the H data from the storage node SN, the data is H data.

In the operations to read out the H data from the storage node SN, the data held in the storage node SN is set at a voltage level higher than a threshold voltage that allows the amplification transistor AT shown in FIG. 1 to enter an on state, and this voltage relation is sustained even during the read operations.

Thus, at a time T1, when the read word line RWL is put in an active state as shown in FIG. 4B in order to turn on the select transistor ST, a voltage is applied between the source and drain of the amplification transistor AT so that the amplification transistor AT is also turned on. Thus, a voltage appearing on the read bit line RBL is discharged to the common source line CSL by way of the select transistor ST and the amplification transistor AT, which have been turned on. As a result, a voltage reversion operation occurs as shown in FIG. 4G. In this voltage reversion operation, the voltage appearing on the read bit line RBL becomes lower than the voltage appearing on the write bit line WBL.

When the sense amplifier SA is put in an active state at a time T2 as shown in FIGS. 4D and 4E, the sense amplifier SA amplifies an electric-potential difference obtained after the voltage reversion operation mentioned above as the electric-potential difference between the voltage appearing on the read bit line RBL and the voltage appearing on the write bit line WBL to a signal with an amplitude of 1.8 V. The state in which the voltage appearing on the read bit line RBL is lower than the voltage appearing on the write bit line WBL corresponds to the H data in the memory cell MCa.

Then, the Y-switch signal YSW shown in FIG. 4F is raised to an H level activating the BL selector 6B shown in FIG. 2 so as to supply the H data read out from the storage node SN to a control circuit provided at the following stage.

FIGS. 5A to 5I are timing charts for operations to write L data into the storage node SN. On the other hand, FIGS. 6A to 6I are timing charts for operations to write H data into the storage node SN.

In either of the write operations with the timing charts thereof shown in FIGS. 5 and 6, the read operations described above need to be carried out before the write word line WWL is put in an active state at a time T4 in order to set a voltage for a refresh process on the write bit line WBL in advance for a reason described as follows.

FIG. 2 shows a configuration including only a column of memory cells included in an array of memory cells and a control circuit for the column of memory cells. In the following description, such a column is referred to as a column unit. In an actual semiconductor memory, however, a plurality of such column units having the same configuration are arranged in the row direction to form an array of memory cells. Memory cells on the same row in the array share a common write word line WWL and a common read word line RWL.

In a random access to such a semiconductor memory, for example, data is written into a predetermined number of memory cells on the same row. These memory cells on the same row form a write unit, which is typically referred to as a byte having a size of 8 bits. In this write operation, write data is set on the global write bit line GWBL in each column unit subjected to the write operation and the Y switch signal YSW is put in an active state in order to forcibly update the electric potential of the write bit line WBL to an electric potential determined by the write data.

As for a column unit not subjected to the write operation, a refresh operation is carried out in place of the write operation. That is to say, when data is read out from a memory cell, voltages output to the read bit line RBL and the write bit line WBL represents data obtained by logically inversion of the data stored in the memory cell as shown in FIGS. 3G and 4G. Thus, in this read-before-write process, the data stored in the memory cell is read out and represented by voltages asserted on the read bit line RBL and the write bit line WBL as voltages with a maximum difference of 1.8 V. For the column unit not subjected to the write operation, control is executed not to activate the Y switch signal YSW. In this way, a refresh process to write back the data represented by the voltages asserted on the read bit line RBL and the write bit line WBL can be carried out in the following activation of the write word line WWL.

As is obvious from the above description, in a semiconductor memory executing such control, a read process needs to be carried out prior to a write operation in order to set a voltage for a refresh process on the write bit line WBL in advance. In the following description, this read process is also referred to as a read-before-write process.

Prior to a time T3 shown in FIGS. 5 and 6, the read operations explained earlier by referring to FIGS. 3 and 4 are carried out as read-before-write processes. The explanation of the read operations explained earlier by referring to FIGS.

3 and 4 is not repeated in the following description in order to avoid duplication. In the following description, the read process carried out prior to the time T3 is also referred to as a read-before-write process as described above and the write operation carried out after the time T3 is also referred to as a write process.

Since the relation of voltages in the L-data write operation shown in FIG. 5 is opposite to the relation of voltages in the H-data write operation shown in FIG. 6, however, the voltages set on the global read bit line GRBL and the global write bit line GWBL in the L-data write operation shown in FIG. 5 may be voltages obtained by inversion of the voltages set on the global read bit line GRBL and the global write bit line GWBL respectively in the H-data write operation shown in FIG. 6.

To put it concretely, a high-level voltage of 1.8 V is set on the global read bit line GRBL in the L-data write operation as shown in FIG. 5H whereas a low-level voltage of 0 V is set on the global write bit line GWBL in the L-data write operation as shown in FIG. 5I.

On the other hand, the low-level voltage of 0 V is set on the global read bit line GRBL in the H-data write operation as shown in FIG. 6H whereas the high-level voltage of 1.8 V is set on the global write bit line GWBL in the H-data write operation as shown in FIG. 6I.

After the read-before-write process is completed, the Y switch signal YSW shown in FIG. 2 is put in an active state at the time T3. As soon as the Y switch signal YSW is put in an active state, the relation of voltages set on the read bit line RBL and the write bit line WBL of the column unit including memory cells subjected to the L-data write operation shown in FIG. 5 or the relation of voltages set on the read bit line RBL and the write bit line WBL of the column unit including memory cells subjected to the H-data write operation shown in FIG. 6 is inverted. In other words, such voltages are set on the global read bit line GRBL and the global write bit line GWBL in the read-before-write process in advance that a post-read write process carried out on each memory cell subjected to the write operation is a process to write data obtained by inversion of data obtained as a result of the read-before-write process to read out data currently stored in each memory cell.

As for a column unit including memory cells not subjected to the write operation, the Y switch signal YSW is not raised to an H level of the active state. Thus, the relation of voltages set on the read bit line RBL and the write bit line WBL of the column unit including these memory cells is sustained even after the time T3 in the same state as the relation right before the time T3. It is to be noted that timing charts for a column unit including memory cells not subjected to the write operation are not shown in any figure.

Then, at the time T4, the write word line WWL is raised to an H level as shown in FIG. 5C or 6C. In this state, the write transistor WT shown in FIG. 1 is turned on, allowing the write data forcibly set on the write bit line WBL into the storage node SN.

At that time, in the column unit not selected by the Y switch signal YSW, data obtained as a result of amplifying a voltage originally appearing on the storage node SN is read out and output to the write bit line WBL as described earlier. Thus, by activating the write word line WWL, the data appearing on the write bit line WBL is again written into the storage node SN of the unselected memory cell in an operation referred to as the refresh process cited before.

After the write operation, the voltage appearing on the write word line WWL is pulled down to an L level of 0 V as shown in FIG. 5 or 6 in order to turn off the write transistor WT. At that time, the voltage appearing on the read word line RWL is sustained at 0 V and the off state of the select transistor ST is maintained as it is till the next read operation. In this standby state, the storage node SN is put in a floating state, holding the electric charge stored therein.

The electric charge held in the storage node SN is stored mainly in a capacitance between a diffusion layer on the source side of the write transistor WT, the substrate and the gate of the write transistor WT and the capacitance of the MOS gate of the amplification transistor AT. Thus, the voltage appearing on the storage node SN decreases with the lapse of time due to, among others, a diffusion-layer junction leak in the write transistor WT and a gate leak in the amplification transistor AT. Since the voltage appearing on the storage node SN decreases with the lapse of time, it is necessary to carry out a refresh operation every time a predetermined period of time lapses since a write operation. In the configuration described above, a refresh operation can be carried out on a specific memory cell in an operation to write data into another memory cell connected on the same row as the specific memory cell.

SUMMARY OF THE INVENTION

As described above, in a read operation carried out by making use of the sense amplifier SA, the relation between the voltages appearing on the read bit line RBL and the write bit line WBL for an operation to read out H data as shown in FIG. 4 is opposite to the relation between the voltages appearing on the read bit line RBL and the write bit line WBL for an operation to read out L data as shown in FIG. 3.

By the way, the parasitic resistance and capacitive load of each of the read bit line RBL and the write bit line WBL increase in proportion to the size of the memory.

Thus, in an operation shown in FIG. 4 as an operation to read out H data, in order to reverse the relation between the voltages appearing on the read bit line RBL and the write bit line WBL, it takes long time between the time T1 to actually start the read operation and the time T2 to get a sufficiently big difference between the voltages appearing on the read bit line RBL and the write bit line WBL. This long period of time obstructs an effort to increase the speed of the read operation.

In addition, during the long period of time of the process carried out by the sense amplifier SA as a process to reverse the relation between the voltages appearing on the read bit line RBL and the write bit line WBL for an operation to read out H data, the read bit line RBL and the write bit line WBL remain at intermediate electric potentials. Thus, a large penetration current flows through the CMOS inverters employed in the sense amplifier SA, obstructing an effort to decrease the amount of power consumed by the sense amplifier SA. As described before, the CMOS inverters each include the PMOS transistor 21 and the NMOS transistor 22.

By the same token, in a write operation carried out by making use of the sense amplifier SA, the relation between the voltages appearing on the read bit line RBL and the write bit line WBL for an operation to write H data as shown in FIG. 6 is opposite to the relation between the voltages appearing on the read bit line RBL and the write bit line WBL for an operation to write L data as shown in FIG. 5.

As described above, the parasitic resistance and capacitive load of each of the read bit line RBL and the write bit line WBL increase in proportion to the size of the memory. Thus, in an operation shown in FIG. 5 as an operation to write L data and an operation shown in FIG. 6 as an operation to write H data, in order to reverse the relation between the voltages appearing on the read bit line RBL and the write bit line WBL, it takes long time between the time T3 to actually start a process to reverse the voltage relation and the time T4 to actually carry out the write process. This long period of time obstructs an effort to increase the speed of the write operation.

In addition, it is also necessary to carry out a read-before-write process and, much like the read operation described above, it takes long time to reverse the relation between the voltages appearing on the read bit line RBL and the write bit line WBL and get a sufficiently big difference between the voltages appearing on the read bit line RBL and the write bit line WBL in the read-before-write process. Thus, the write cycle time becomes even longer.

In a process to reverse the relation between the voltages appearing on the read bit line RBL and the write bit line WBL in the write operation, the read bit line RBL and the write bit line WBL are set forcibly at voltages determined in accordance with data given by an external source as data to be written. After the time T3 shown in FIGS. 5 and 6 as a time to actually start an operation to reverse the relation between the voltages appearing on the read bit line RBL and the write bit line WBL, the read bit line RBL and the write bit line WBL remain at intermediate electric potentials for a long period of time because the sense amplifier SA has been put in an active state since the time T2 leading ahead of the time T3. Thus, a large penetration current flows through the CMOS inverters of the sense amplifier SA, obstructing an effort to decrease the power consumption.

By the way, in the field of a DRAM cell having the 1-transistor-to-1-capacitor type, there is known a configuration in which a transistor is provided for isolating the bit line and the sense amplifier SA from each other as disclosed in documents such as Japanese Patent Laid-open No. 2005-145931.

However, this configuration is provided for the purpose of raising the speed of the sensing operation. An electric-potential difference appearing between a pair of bit lines as a difference in electric potential for carrying out a refresh operation is amplified to a voltage between 0 V and a power-supply voltage Vdd. Thus, during a read operation and a write operation, a large current of the pair of activated bit lines is discharged, obstructing an effort to decrease the power consumption.

Addressing the problems described above, there is a need for the present invention to innovate a semiconductor memory device having memory cells each carrying out an operation to input or write data through a node and an operation to output or read out data through a node different from the node for the input or read operation so as to increase the speeds of the read and write operations as well as reduce the power consumption of the operations.

The semiconductor memory device provided by the present invention has a memory-cell array, a read bit line, a write bit line, a sense amplifier, a first sense line, a second sense line, a first bit line switch, and a second bit line switch. The memory-cell array includes memory cells laid out to form an array. The read bit line is shared by a plurality of aforementioned specific memory cells arranged in one direction in the memory-cell array and connected to a data output node of each of the specific memory cells. The write bit line is shared by a plurality of the specific memory cells and connected to a data input node of each of the specific memory cells. The sense amplifier is configured to sense a difference in electric potential between the read bit line and the write bit line. The first sense line is connected to one of the input terminals of the sense amplifier. The second sense line is connected to the other input terminal of the sense amplifier. The first bit line switch is configured to control electrical connection and disconnection between the first sense line and the read bit line. The second bit line switch is configured to control electrical connection and disconnection between the second sense line and the write bit line.

It is desirable to provide a configuration in which the semiconductor memory device provided by the present invention further has a bit line switch control circuit configured to control the voltage of the first bit line switch and the voltage of the second bit line switch independently of each other.

It is desirable to provide another configuration in which the bit line switch control circuit is a circuit for executing control to change the states of the first bit line switch and the second bit line switch from an on or conductive state to an off or nonconductive state in an operation to read out data and turn on the second bit line switch only in an operation to write data.

It is desirable to provide a further configuration in which the bit line switch control circuit is a circuit for executing control to: put both the first bit line switch and the second bit line switch in an on state; put both the first bit line switch and the second bit line switch in an off state; and turn on only the second bit line switch. Both the first bit line switch and the second bit line switch are in an on state in advance till data is output to the read bit line and propagated to the first sense line. Both the first bit line switch and the second bit line switch are in an off state prior to activation of the sense amplifier. The second bit line switch is in an operation to write data into a specific one of the memory cells after reading out data from the specific memory cell by inverting or not inverting output data generated by the activated sense amplifier as a result of amplifying the amplitude of a signal appearing between the first sense line and the second sense line to represent the data read out from the specific memory.

An operation method provided by the present invention as a method to be adopted for the semiconductor memory device has a memory-cell array, a read bit line, a write bit line, and a sense amplifier. The memory-cell array includes memory cells laid out to form an array. The read bit line is shared by a plurality of aforementioned specific memory cells arranged in one direction in the memory-cell array and connected to data output nodes of the specific memory cells. The write bit line is shared by the specific memory cells and connected to data input nodes of the specific memory cells. The sense amplifier is configured to sense a difference in electric potential between the read bit line and the write bit line. The operation method includes the steps of: executing control to change the states of the read bit line and the write bit line from a state of being electrically connected to the sense amplifier to a state of being electrically disconnected from the sense amplifier in an operation to read out data; and electrically connecting the write bit line only to the sense amplifier in an operation to write data.

It is desirable to provide a configuration in which the operation method provided by the present invention further includes the steps of: putting both the read bit line and the write bit line in a state of being electrically connected; putting both the read bit line and the write bit line in a state of being electrically disconnected; letting the activated sense amplifier amplify the amplitude; and putting only the write bit line in a state of being again electrically connected. Both the read bit line and the write bit line are in a state of being electrically connected to the sense amplifier till data is output to the read bit line and propagated to one of the input terminals of the sense amplifier. Both the read bit line and the write bit line are in a state of being electrically disconnected from the sense amplifier prior to activation of the sense amplifier. The activated sense amplifier amplify the amplitude of a signal sensed between the input terminals of the sense amplifier as a signal representing a difference in electric potential between the read bit line and the write bit line. The write bit line is in a state of being again electrically connected to the sense amplifier in an operation to write data into a specific one of the memory cells after reading out data from the specific memory cell by inverting or not inverting output data generated by the activated sense amplifier as a result of amplifying the amplitude of a signal appearing between the read bit line and the write bit line to represent the data read out from the specific memory.

It is desirable to provide another configuration in which, in a period of time other than an operation to read out data and an operation to write data, the state of being electrically disconnected from the sense amplifier is sustained as a state of both the read bit line and the write bit line.

In accordance with the present invention, a semiconductor memory device has memory cells each carrying out an operation to input or write data through a node and an operation to output or read out data through a node different from the node for the input or read operation so as to increase the speeds of the read and write operations as well as reduce the power consumption of the operations.

BRIEF DESCRIPTION OF THE DRAWINGS

FIGS. 3A to 3G show timing charts for an operation to read out L data from a memory cell having the configuration shown in FIG. 2;

FIGS. 4A to 4G show timing charts for an operation to read out H data from a memory cell having the configuration shown in FIG. 2;

FIGS. 5A to 5I show timing charts for an operation to write L data into a memory cell having the configuration shown in FIG. 2;

FIGS. 6A to 6I show timing charts for an operation to write H data into a memory cell having the configuration shown in FIG. 2;

FIG. 16 is a diagram showing the circuit of a BLI driver;

FIGS. 17A to 17E show timing charts for control of bit-line isolation signals:

FIGS. 18A to 18L show timing charts for an operation to read out H data in accordance with the embodiment;

FIGS. 19A to 19L show timing charts for an operation to read out L data in accordance with the embodiment;

FIGS. 20A to 20M show timing charts for an operation to write L data in accordance with the embodiment;

FIGS. 21A to 21M show timing charts for an operation to write H data in accordance with the embodiment;

DETAILED DESCRIPTION OF THE PREFERRED EMBODIMENTS

Preferred embodiments of the present invention are explained by referring to diagrams as follows.

<<Whole Configuration>>

Figure 8:
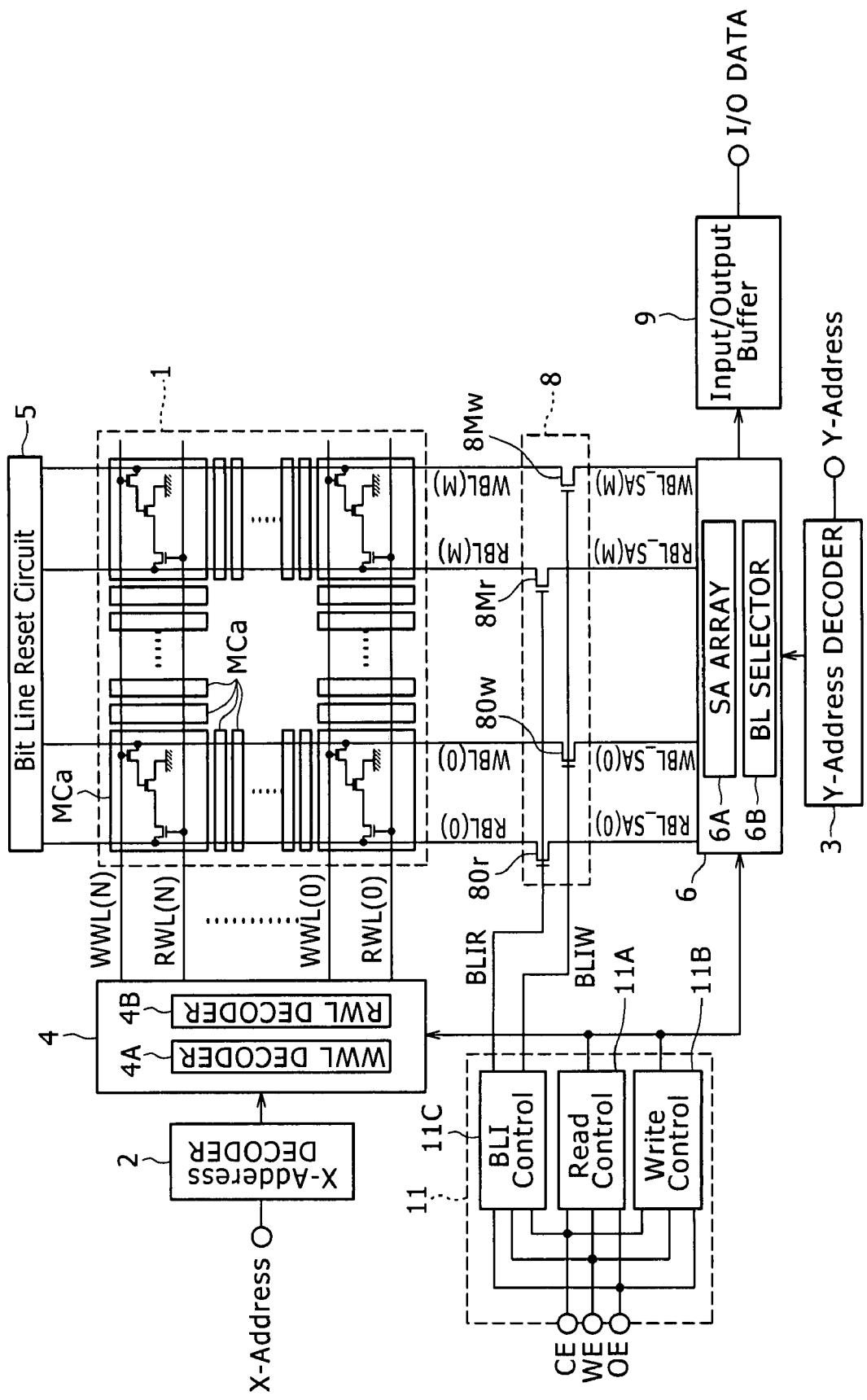
FIG. 8 is a simplified block diagram showing a semiconductor memory device according to the embodiment.

FIG. 8 is a simplified block diagram showing a semiconductor memory device.

Figure 1:
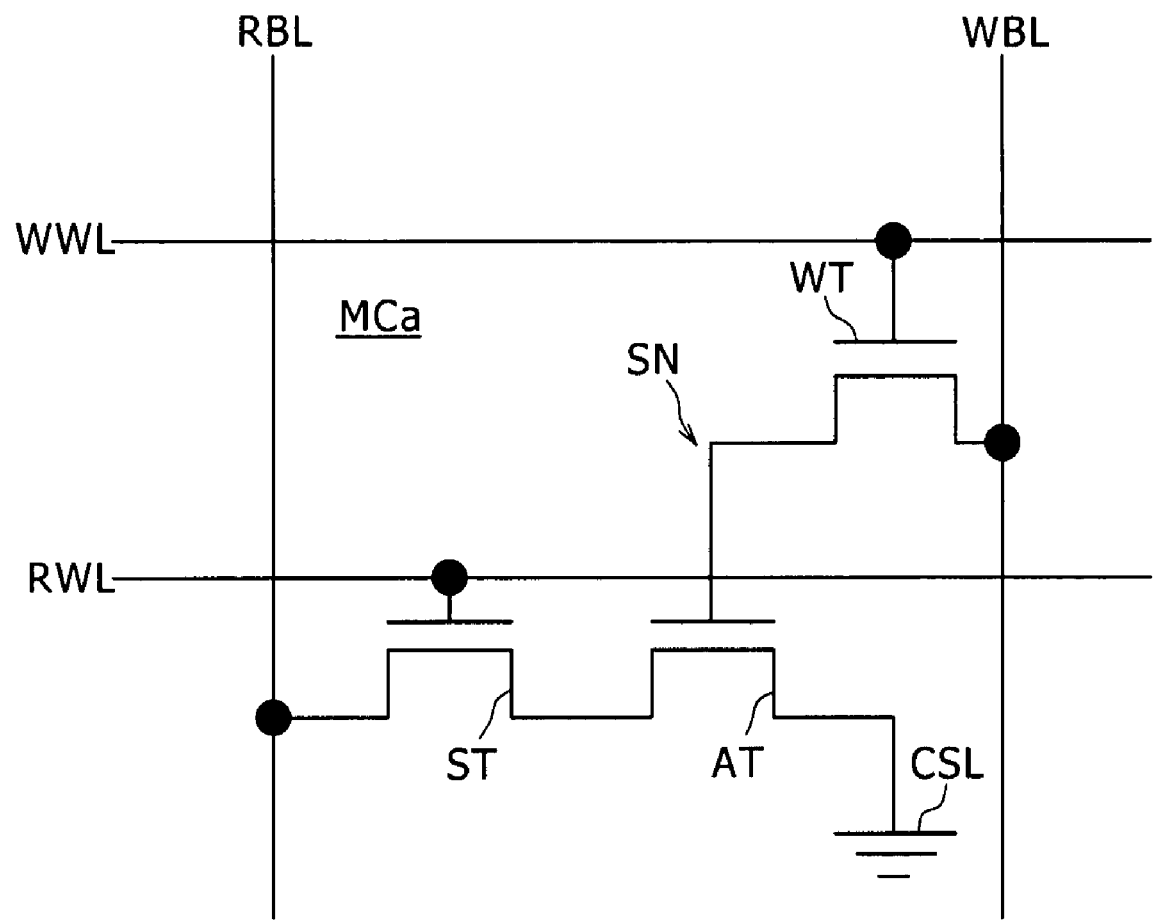
FIG. 1 is a diagram showing an equivalent circuit of a 3T-type gain cell according to a related art and an embodiment of the present invention.
Figure 2:
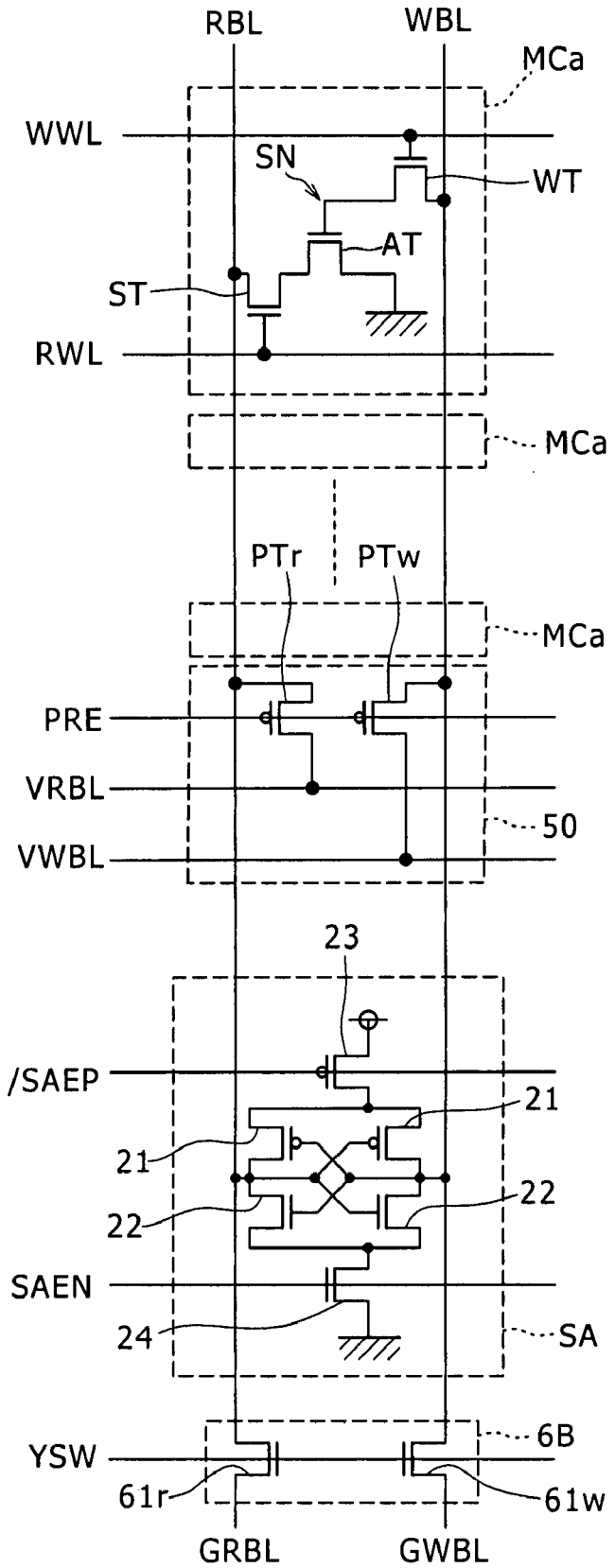
FIG. 2 is a diagram showing a circuit including a memory-cell control system according to the related art.
Figure 7:
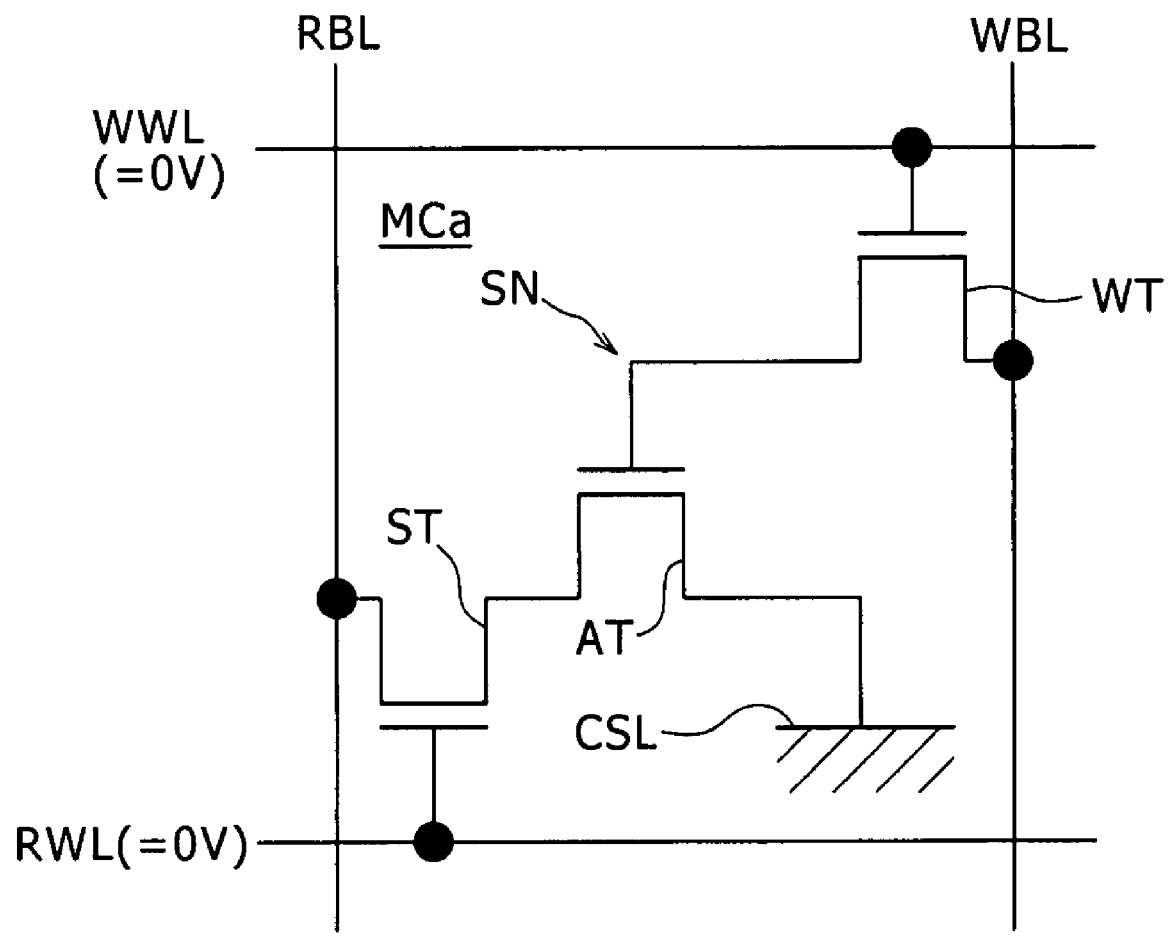
FIG. 7 is a diagram showing an equivalent circuit of a gain cell according to the related art as a circuit for holding data in the cell.

The semiconductor memory device shown in the figure has a memory-cell array 1 including a number of memory cells MCa, which are each shown in FIG. 1 and laid out to form a matrix, and peripheral circuits for the memory-cell array 1.

As shown in FIG. 8, the peripheral circuits include an X-address decoder 2, a Y-address decoder 3, a row decoder 4, a bit-line reset circuit 5, a column circuit 6, a BLI (bit line isolation) circuit 8, a input/output buffer 9 and a control circuit 11.

The BLI circuit 8 is one of prominent characteristics of the semiconductor memory device. Details of the BLI circuit 8 will be described later.

The X-address decoder 2 is a circuit for decoding an input X-address signal and supplying the result of the decoding process to the row decoder 4.

The Y-address decoder 3 is a circuit for decoding an input Y-address signal and supplying the result of the decoding process to the column circuit 6.

The row decoder 4 has a WWL decoder 4A and an RWL decoder 4B. The WWL decoder 4A is a unit for selecting a write word line WWL and applying a predetermined voltage to the selected write word line WWL whereas the RWL decoder 4B is a unit for selecting a read word line RWL and applying a predetermined voltage to the selected read word line RWL.

The bit-line reset circuit 5 is a circuit for resetting the voltage appearing on a bit-line pair composing of a read bit line RBL and a write bit line WBL. In the following description, the bit-line pair composing of a write bit line WBL and a read bit line RBL is referred to as a bit-line pair RBL-WBL.

As will be described in detail later, the column circuit 6 includes an array 6A and a BL selector 6B. The array 6A is an array of SAs (sense amplifiers), which are each a sense amplifier of the cross couple latch type. The BL selector GB is a unit for selecting a bit-line pair RBL-WBL on the basis of a decoding result produced by the Y-address decoder 3.

The control circuit 11 has a read control circuit 11A, a write control circuit 11B and a BLI control circuit 11C each operating on the basis of three received enable signals, i.e., a chip enable signal CE, a write enable signal WE and an output (read) enable signal OE. The read control circuit 11A is a circuit for controlling the row decoder 4 and the column circuit 6 in a read operation. The write control circuit 11B is a circuit for controlling the row decoder 4 and the column circuit 6 in a write operation. The BLI control circuit 11C is a circuit for controlling the BLI circuit 8. The BLI control circuit 11C is a typical element functioning as a bit line switch control circuit provided by the embodiment of the present invention.

Each of the memory cells MCa composing the memory-cell array 1 is connected to a word-line pair, which includes of a write word line WWL and a read word line RWL, and a bit-line pair RBL-WBL.

There is provided a total of (N+1) write word lines WWL, namely, write word lines WWL (0) to WWL (N). By the same token, there is provided a total of (N+1) read word lines RWL, namely, read word lines RWL (0) to RWL (N).

In addition, there is provided a total of (M+1) write bit lines WBL, namely, write bit lines WBL (0) to WBL (M). By the same token, there is provided a total of (M+1) read bit lines RBL, namely, read bit lines RBL (0) to RBL (M).

On the top of that, a sense line is provided for each of the read bit lines RBL as a local bit line connected to the SA array 6A employed in the column circuit 6. In the following description, the sense line is referred to as an RBL sense line. Thus, there is provided a total of (M+1) RBL sense lines, namely, RBL sense lines RBL_SA (0) to RBL_SA (M). By the same token, a sense line is provided for each of the write bit line WBL as a local bit line connected to the SA array 6A employed in the column circuit 6. In the following description, this sense line is referred to as a WBL sense line. Thus, there is provided a total of (M+1) WBL sense lines, namely, WBL sense lines WBL_SA (0) to WBL_SA (M). The RBL sense line RBL_SA is a typical element functioning as a first sense line provided by the present embodiment whereas the WBL sense line WBL_SA is a typical element functioning as a second sense line provided by the present embodiment.

The BLI circuit 8 shown in FIG. 8 includes 2M BL switches provided for the M read bit lines RBL (0) to RBL (M) and the M write bit lines WBL (0) to WBL (M) respectively. In the case of the embodiment shown in FIG. 8, the BL switches are each an NMOS transistor. To put it in more detail, for each bit-line pair RBL-WBL, there are provided two BL switches, namely, BL switches 8ir and 8iw where i=0, 1, ..., M. The BL switch 8ir is a typical element functioning as a first bit line control switch provided by the present embodiment whereas the BL switch 8iw is a typical element functioning as a second bit line control switch provided by the present embodiment.

To be more specific, the BL switch 80r shown in FIG. 8 is a switch for controlling connection between the read bit line RBL (0) and the RBL sense line RBL_SA (0) whereas the BL switch 80w shown in the same figure is a switch for controlling connection between the write bit line WBL (0) and the WBL sense line WBL_SA (0). By the same token, the BL switch 8Mr shown in FIG. 8 is a switch for controlling connection between the read bit line RBL (M) and the RBL sense line RBL_SA (M) whereas the BL switch 8Mw shown in the same figure is a switch for controlling connection between the write bit line WBL (M) and the WBL sense line WBL_SA (M).

The BL switch 8ir is controlled by an RBL isolation signal BLIR output by the BLI control circuit 11C whereas the BL switch 8iw is controlled by a WBL isolation signal BLIW also output by the BLI control circuit 11C.

Figure 9:
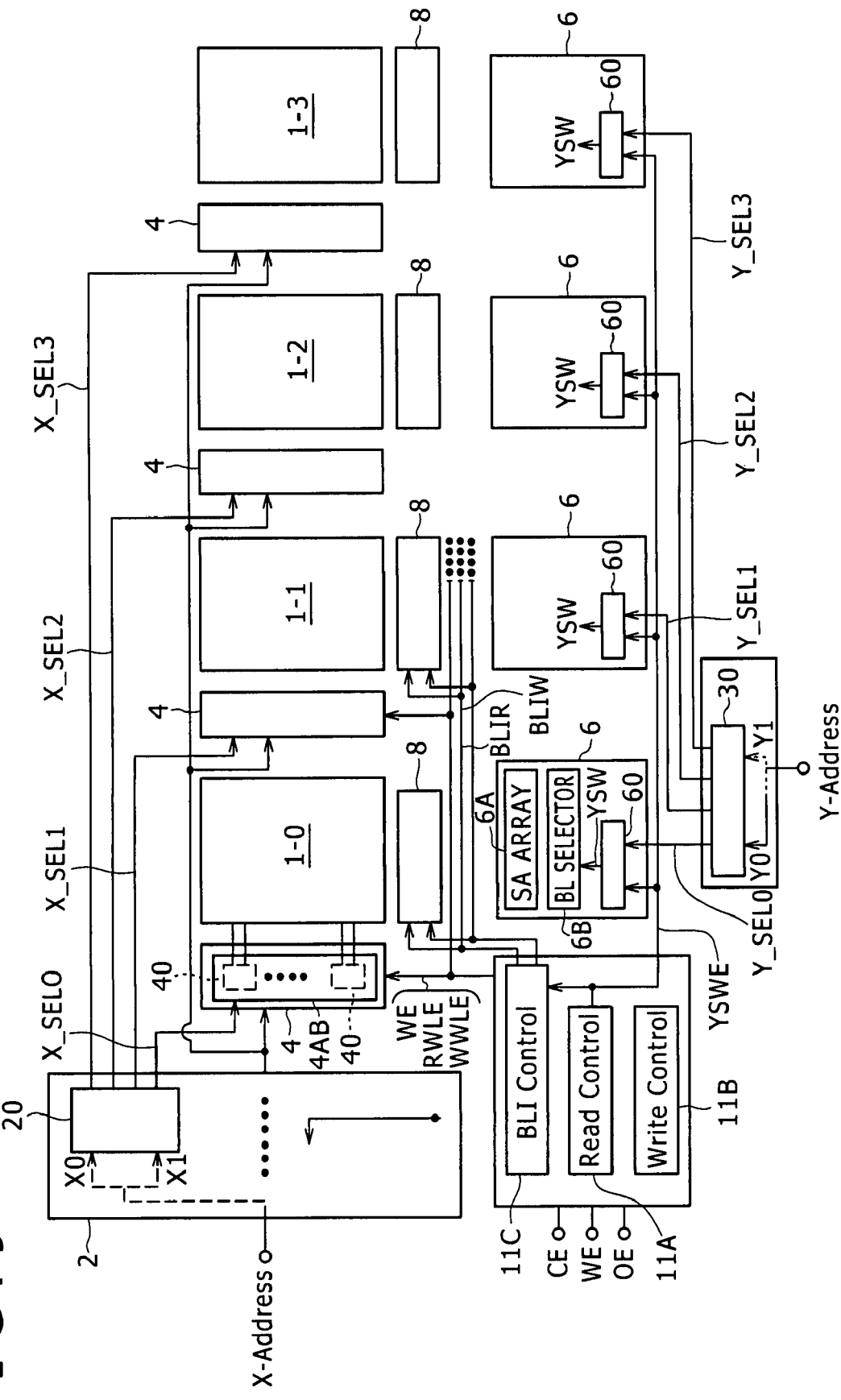
FIG. 9 is a block diagram showing details of the semiconductor memory device shown in FIG. 8.

FIG. 9 is a block diagram showing more details than the block diagram of FIG. 8.

As shown in FIG. 9, the actual memory-cell array 1 includes a plurality of cell-array blocks. In the case of this embodiment, the memory-cell array 1 includes four cell-array blocks 1-0, 1-1, 1-2 and 1-3.

A row decoder 4, a column circuit 6 and a BLI circuit 8 are provided for each of the cell-array blocks 1-0, 1-1, 1-2 and 1-3. As shown in FIG. 8, the row decoder 4 has the WWL decoder 4A and the RWL decoder 4B. However, the diagram of FIG. 9 shows a configuration in which each of the row decoders 4 has a word-line decoder 4AB for executing the functions of both the WWL decoder 4A and the RWL decoder 4B.

As shown in FIG. 9, the X-address decoder 2 includes an X selector 20 functioning as a circuit for selecting one of the four row decoders 4. The X selector 20 decodes X-address bits X0 and X1 in order to select one of the four row decoders 4.

The X selector 20 outputs an X select signal X_SEL0 for selecting the cell-array block 1-0 to the row decoder 4, an X select signal X_SEL1 for selecting the cell-array block 1-1 to the row decoder 4, an X select signal X_SEL2 for selecting the cell-array block 1-2 to the row decoder 4 or an X select signal X_SEL3 for selecting the cell-array block 1-3 to the row decoder 4.

As shown in FIG. 9, the Y-address decoder 3 includes a Y selector 30 functioning as a circuit for selecting one of the four column circuits 6. The Y selector 30 decodes Y-address bits Y0 and Y1 in order to select one of the four column circuits 6.

The Y selector 30 outputs a Y select signal Y_SEL0 for selecting the cell-array block 1-0 to the column circuit 6, a Y select signal Y_SEL1 for selecting the cell-array block 1-1 to the column circuit 6, a Y select signal Y_SEL2 for selecting the cell-array block 1-2 to the column circuit 6 or a Y select signal Y_SEL3 for selecting the cell-array block 1-3 to the column circuit 6.

Each of the column circuits 6 includes a YSW gate circuit 60 in addition to the SA array 6A and the BL selector 6B.

The YSW gate circuit 60 is a circuit for receiving a Y-switch enable signal YSWE from the write control circuit 11B employed in the control circuit 11 and one of the Y select signals Y_SEL0 to Y_SEL3 from the Y selector 30, generating a Y-switch signal YSW from the Y-switch enable signal YSWE and the Y select signal Y_SEL and outputting the Y-switch signal YSW to the BL selector 6B.

It is to be noted that the read control circuit 11A is capable of outputting an RBL isolation signal BLIR and a WBL isolation signal BLIW to each of the four BLI circuits 8. In addition, the control circuit 11 is capable of outputting a write enable signal WE, an RWL enable signal RWLE and a WWL enable signal WWLE to each of the four row decoders 4.

<<Memory-Cell Control System Circuit>>

The following description explains the configuration of a memory-cell control system circuit connected to the bit-line pair RBL-WBL.

Figure 10:
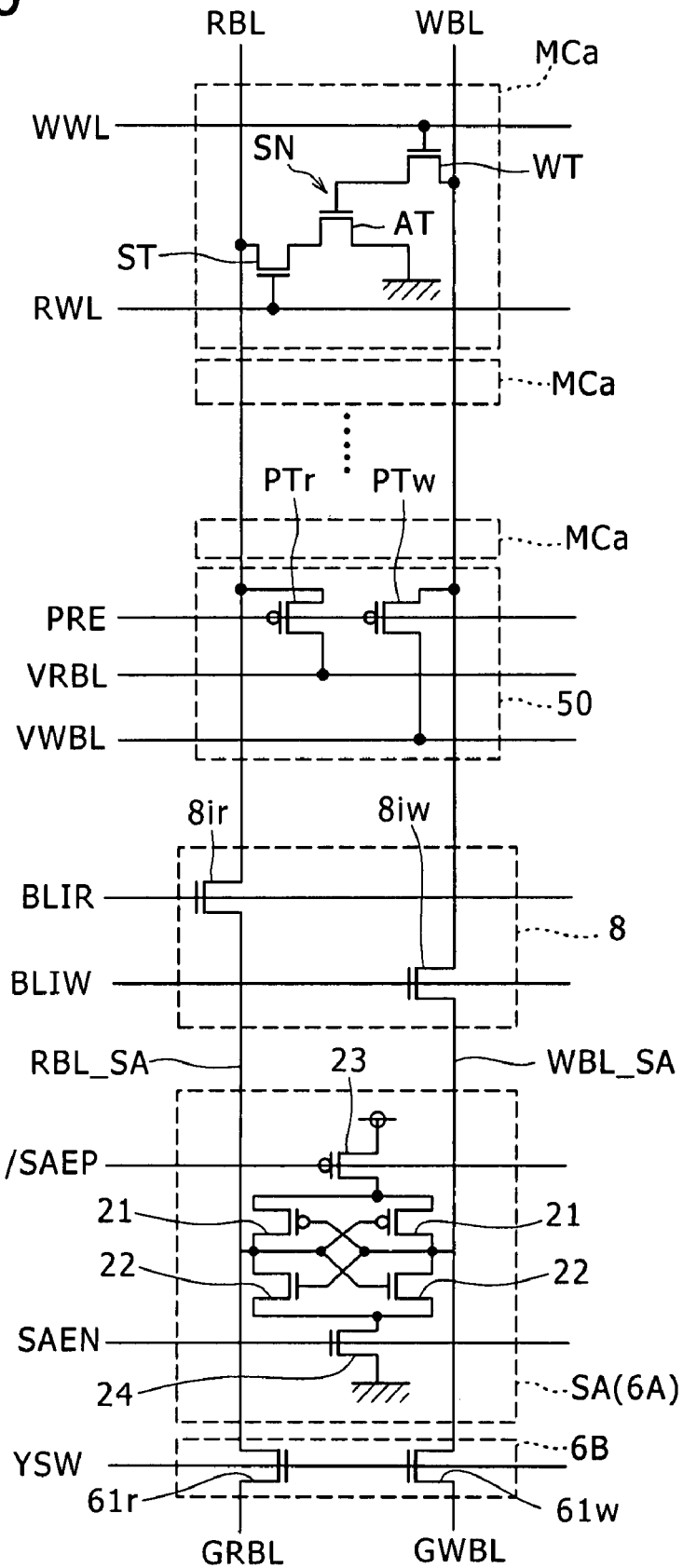
FIG. 10 is a diagram showing the circuit of a column unit.

FIG. 10 is a diagram showing circuits ranging from a memory cell MCa to an SA array 6A.

In the circuits shown in FIG. 10, a plurality of memory cells MCa each having the configuration shown in FIG. 1 are arranged in the column direction. As described earlier, N memory cells MCa are laid out on each column of the memory-cell matrix. The memory cells MCa laid out on each column share a bit-line pair RBL-WBL composing a read bit line RBL and a write bit line WBL, which are provided for the column.

The bit-line pair RBL-WBL is connected to a pre-charge circuit 50 having two pre-charge transistors PTr and PTw, which are each a PMOS transistor. As shown in FIG. 8, the pre-charge circuit 50 is included in the bit-line reset circuit 5.

The drain of the pre-charge transistor PTr is connected to the read bit line RBL whereas the source thereof is connected to a line supplying a voltage VRBL. The drain of the pre-charge transistor PTw is connected to the write bit line WBL whereas the source thereof is connected to a line supplying a voltage VWBL. The two pre-charge transistors PTr and PTw are controlled by a pre-charge enable signal PRE, which is a common signal.

On the other side of the pre-charge circuit 50 (or the side opposite to the memory cell MCa), a BLI circuit 8 explained earlier by referring to FIG. 8 is provided.

As described earlier, the BL switch 8*ir* employed in the BLI circuit 8 is an NMOS transistor for controlling connection between the read bit line RBL and the RBL sense line RBL_SA whereas the BL switch 8*iw* employed in the BLI circuit 8 is an NMOS transistor for controlling connection between the write bit line WBL and the WBL sense line WBL_SA.

The configuration individually providing electrical isolation between the read bit line RBL and the sense amplifier SA as well as between the write bit line WBL and the sense amplifier SA as described above is one of characteristics of the embodiment provided by the present invention.

The RBL sense line RBL_SA and the WBL sense line WBL_SA form a sense-line pair referred to hereafter as a sense-line pair RBL_SA-WBL_SA, which is connected to a sense amplifier SA of a cross couple latch type. In the following description, the sense amplifier SA of a cross couple latch type is referred to simply as a sense amplifier SA.

As shown in the figure, the sense amplifier SA includes two inverters, which are wired in cross connection. That is to say, the input of a specific one of the inverters is connected to the output of the other inverter and the output of the specific inverter is connected to the input of the other inverter. Each of the inverters includes a PMOS transistor 21 and a NMOS transistor 22.

A PMOS transistor 23 controlled by an SA enable inverted signal /SAEP, which is an active low signal, is connected to a junction point between a source common to the two PMOS transistors 21 and a power-supply voltage line. On the other hand, a NMOS transistor 24 controlled by an SA enable signal SAEN, which is an active high signal, is connected to a junction point between a source common to the two NMOS transistors 22 and the ground line. The two SA enable lines /SAEP and SAEN are each shared by other sensor amplifiers SA laid out in the row direction. It is to be noted, however, that the other sensor amplifiers SA are not shown in the figure.

The BL selector 6B is provided to function as a circuit for electrically isolating the sense-line pair RBL_SA-WBL_SA connected to the sense amplifier SA and the BLI circuit 8 from other control circuits.

The BL selector 6B includes an NMOS switch 61*r* and an NMOS switch 61*w*, which form an NMOS-switch pair. The NMOS switch 61*r* is connected between the RBL sense line RBL_SA and a global read bit line GRBL. The NMOS switch 61*w* is connected between the WBL sense line WBL_SA and a global write bit line GWBL. The BL selector 6B, which is a pair composing of the NMOS switch 61*r* and the NMOS switch 61*w*, is provided for every sense-line pair RBL_SA-WBL_SA.

Figure 11:
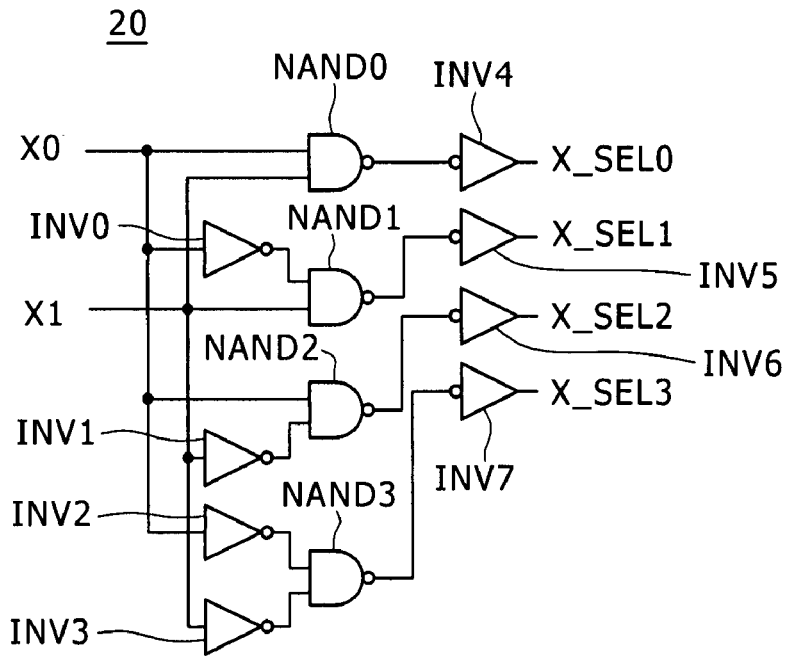
FIG. 11 is a diagram showing the circuit of an X selector.

FIG. 11 is a diagram showing a typical circuit of the X selector 20.

As shown in the figure, the X selector 20 includes four inverters INV0 to INV3 provided at the front stage, four nand circuits NAND0 to NAND3 provided at the middle stage and four other inverters INV4 to INV7 provided at the rear stage.

The X selector 20 receives and decodes X-address bits X0 and X1. In accordance with the result of the decoding process, the X selector 20 activates one of four output X select signals X_SEL0 to X_SEL3 by typically raising the signal to be activated to a high level.

Figure 12:
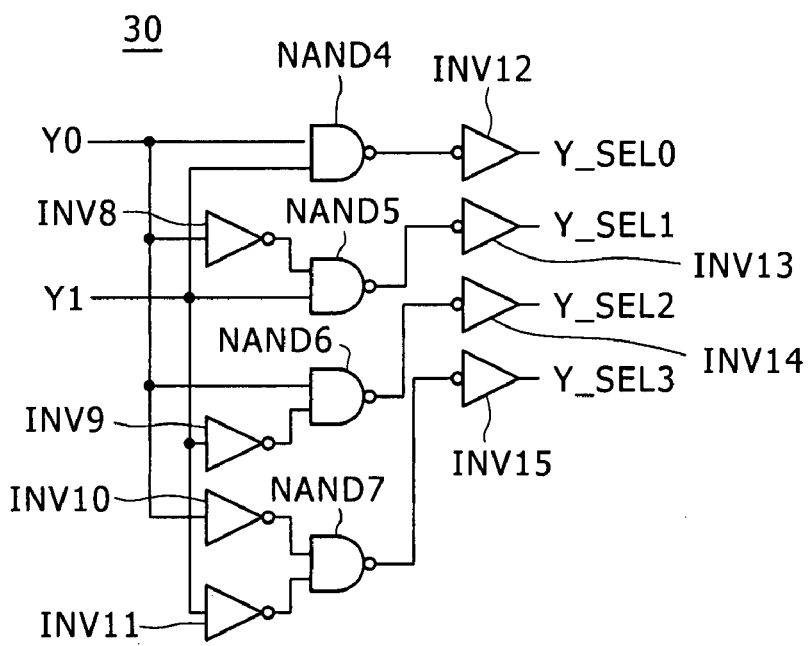
FIG. 12 is a diagram showing the circuit of a Y selector.

FIG. 12 is a diagram showing a typical circuit of the Y selector 30.

As shown in the figure, the Y selector 30 includes four inverters INV8 to INV11 provided at the front stage, four nand circuits NAND4 to NAND7 provided at the middle stage and four other inverters INV12 to INV15 provided at the rear stage.

The Y selector 30 receives and decodes Y-address bits Y0 and Y1. In accordance with the result of the decoding process, the Y selector 30 activates one of four output Y select signals Y_SEL0 to Y_SEL3 by typically raising the signal to be activated to a high level.

Figure 13:
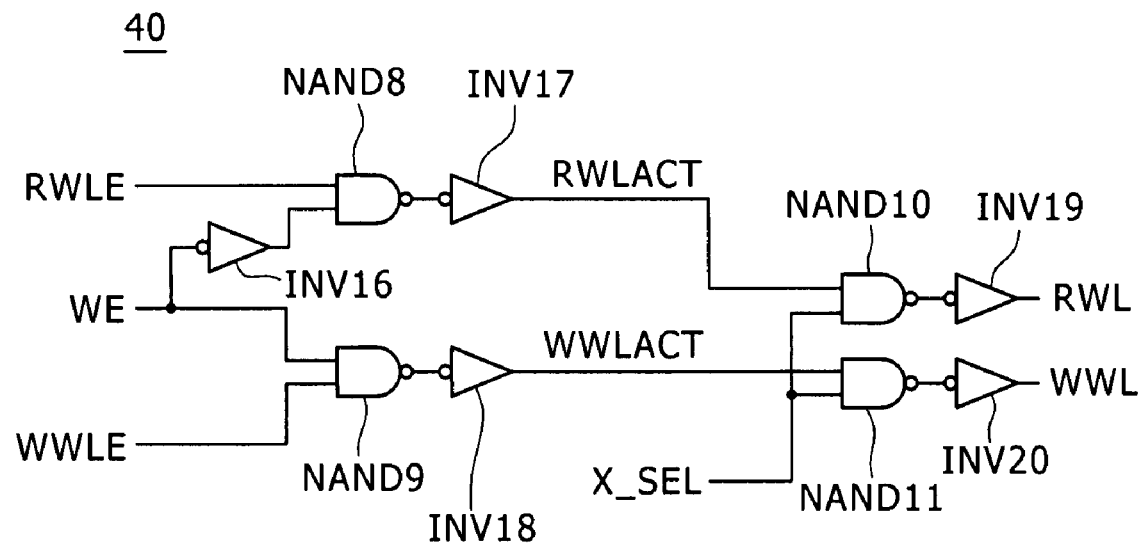
FIG. 13 is a diagram showing the circuit of a row decoder unit.

FIG. 13 is a diagram showing a typical circuit of a row decoder unit 40 forming the basic configuration of the word-line decoder 4AB. N row decoder units 40 each shown in FIG. 13 are arranged in the column direction inside the word-line decoder 4AB explained earlier by referring to FIG. 9.

The word-line decoder 4AB including the N row decoder units 40 is a circuit driven to operate by an X select signal X_SEL selectively activated by the X selector 20 explained earlier by referring to FIG. 11. The word-line decoder 4AB including the N row decoder units 40 decodes X-address bits included in an X-address signal as bits other than the X-address bits X0 and X1 and, in accordance with the result of the decoding process, activates a word-line pair, which is a pair composing of a read word line RWL and a write word line WWL. To put it in detail, in accordance with the result of the decoding process, one of the N row decoder units 40 is selected and the selected row decoder unit 40 activates a word-line pair. However, FIG. 13 does not show a circuit portion for decoding X-address bits included in the X-address signal as bits other than the X-address bits X0 and X1 and selecting one of the N row decoder units 40.

The row decoder unit 40 shown in FIG. 13 includes four nand circuits NAND 8 to NAND 11 and five inverters INV16 to INV20.

The inverters INV16, INV17 and INV19 as well as the nand circuits NAND 8 and NAND10 form an activation circuit for activating the read word line RWL as follows. The RWL enable signal RWLE is applied to one of the input terminals of the nand circuit NAND8. The write enable signal WE is set at a low level in an inactive state (or a read operation). At that time, an output generated by the inverter INV16 as a signal supplied to the other input terminal of the nand circuit NAND8 is set at a high level. Thus, the output of the nand circuit NAND8 is set at a low level. The output of the nand circuit NAND8 is inverted by the inverter INV17 and supplied to one of the input terminals of the nand circuit NAND10 as an RWL activation signal RWLACT set at a high level.

At that time, if an X select signal X_SEL (that is, one of the X select signals X_SEL0 to X_SEL3) applied to the other input terminal of the nand circuit NAND10 is put at a high level in order to put the signal in an active state, the output of the nand circuit NAND10 is set at a low level, raising the read word line RWL connected to the output terminal of the inverter INV9 to a high level in order to put the signal on the line in an active state.

On the other hand, the inverters INV18 and INV20 as well as the nand circuits NAND 9 and NAND11 form an activation circuit for activating the write word line WWL as follows. The WWL enable signal WWLE is supplied to one of the input terminals of the nand circuit NAND9. The write enable signal WE is set at a high level in an active state (or a write operation) and supplied to the other input terminal of the nand circuit NAND9. Thus, the output of the nand circuit NAND9 is set at a low level. The output of the nand circuit NAND9 is inverted by the inverter INV18 and applied to one of the input terminals of the nand circuit NAND11 as a WWL activation signal WWLACT set at a high level.

At that time, if a Y select signal Y_SEL (that is, one of the Y select signals Y_SEL0 to Y_SEL3) applied to the other input terminal of the nand circuit NAND11 is put at a high level in order to put the signal in an active state, the output of the nand circuit NAND11 is set at a low level, raising the write word line WWL connected to the output terminal of the inverter INV20 to a high level in order to put the signal on the line in an active state.

Figure 14:
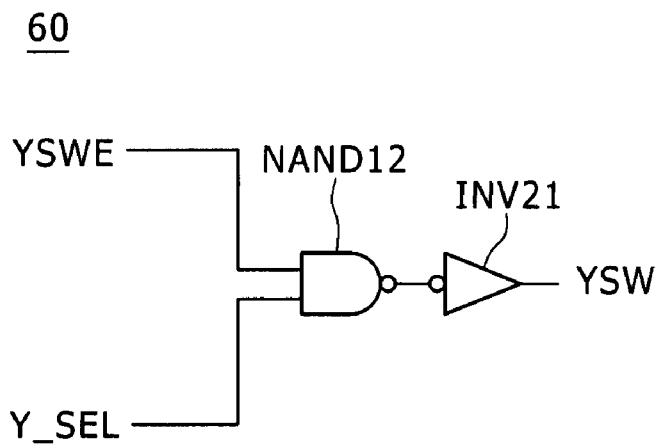
FIG. 14 is a diagram showing an YSW gate circuit.

FIG. 14 is a diagram showing a typical circuit of the YSW gate circuit 60.

The YSW gate circuit 60 shown in FIG. 14 includes a nand circuit NAND12 and an inverter INV21. The output of the nand circuit NAND12 is supplied to the inverter INV21.

The Y-switch enable signal YSWE is supplied to one of the input terminals of the nand circuit NAND12 whereas a Y select signal Y_SEL selected by the Y selector 30 shown in FIG. 12 is supplied to the other input terminal of the nand circuit NAND12. When both the Y-switch enable signal YSWE and the Y_SEL are at a high level defined for an active state, the output of the nand circuit NAND12 is set at a low level. The Y switch signal YSW activated by the inverter INV21 as its output signal set at a high level is supplied to the BL selector 6B shown in FIG. 10.

Figure 15:
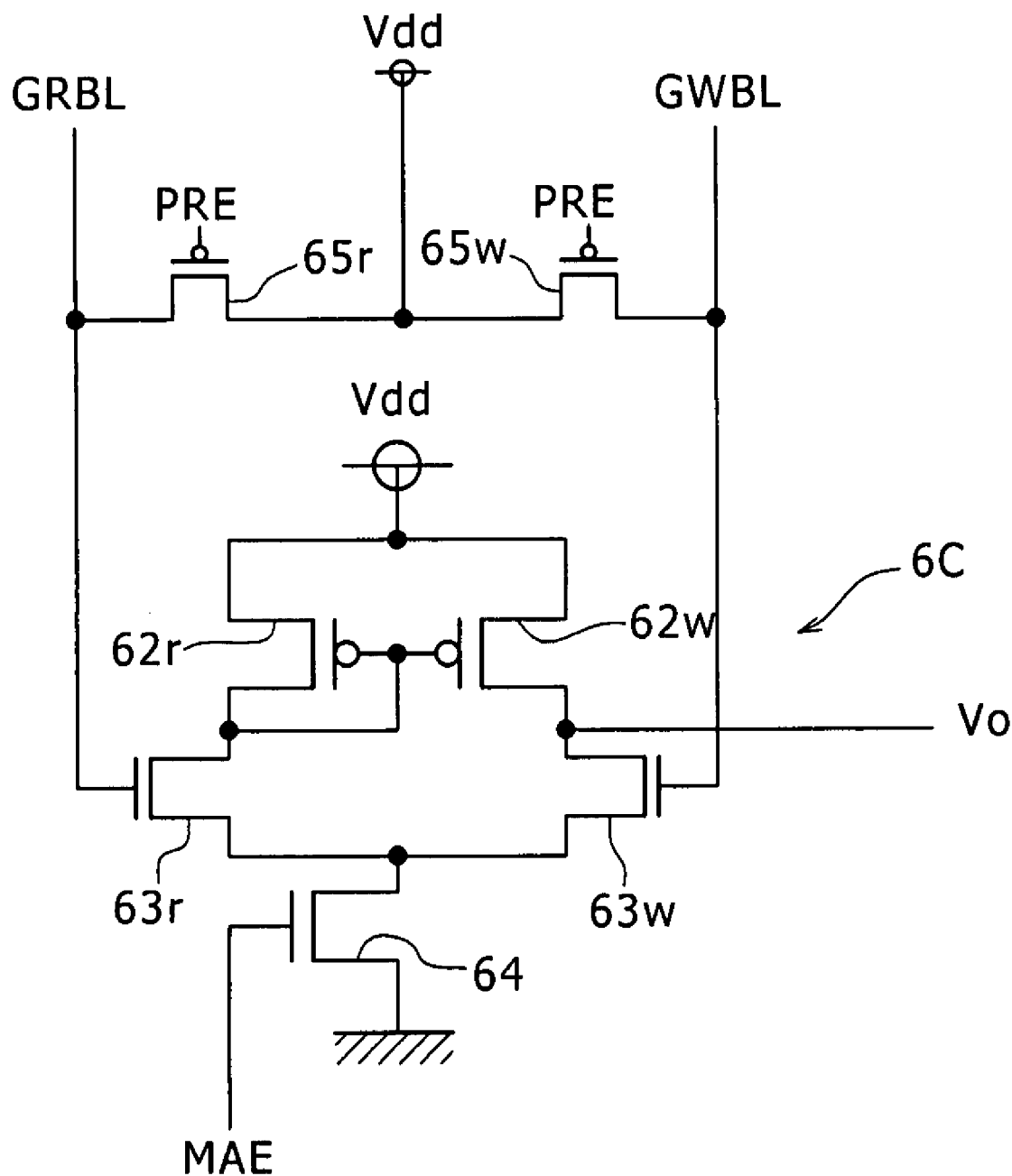
FIG. 15 is a diagram showing the circuit of the configuration of an amplifier circuit.

FIG. 15 is a diagram showing a typical circuit 6C functioning as an amplifier connected to the global read bit line GRBL and the global write bit line GWBL, which are shown in FIG. 10. The amplifier circuit 6C shown in FIG. 15 is included in each column circuit 6 even though FIG. 10 does not show the amplifier circuit 6C itself.

Implemented as an amplifier of a current mirror type, the amplifier circuit 6C includes two PMOS transistors 62r and 62w as well as three NMOS transistors 63r, 63w and 64. The gate of the NMOS transistor 63r is connected to the global read bit line GRBL whereas the gate of the NMOS transistor 63w is connected to the global write bit line GWBL.

The sources of the PMOS transistor 62r and the PMOS transistor 62w are connected to each other and connected to a line supplying a power-supply voltage Vdd. The sources of the NMOS transistor 63r and the NMOS transistor 63w are connected to each other and connected to the ground line through an NMOS transistor 64. The drains of the PMOS transistor 62r and the NMOS transistor 63r are connected to each other and connected to the gates of the PMOS transistor 62r and the PMOS transistor 62w. The gates of the PMOS transistor 62r and the PMOS transistor 62w are connected to each other. The drains of the PMOS transistor 62w and the NMOS transistor 63w are connected to each other and connected to a line for generating an output voltage Vo. It is to be noted that, in place of the output voltage Vo, data can be input from a latch circuit not shown in the figure.

The amplifier circuit 6C is put in an active state by a main-amplifier enable signal MAE supplied to the gate of the NMOS transistor 64.

It is also worth noting that the global read bit line GRBL can be connected to the line supplying the power-supply voltage Vdd through a PMOS transistor 65r whereas the global write bit line GWBL can be connected to the line supplying the power-supply voltage Vdd through a PMOS transistor 65w. Much like the pre-charge transistors PTr and PTw shown in FIG. 10, the PMOS transistors 65r and 65w are controlled by the pre-charge enable signal PRE.

FIG. 16 is a diagram showing a typical driver circuit for generating an RBL isolation signal BLIR and a WBL isolation signal BLIW. In the following description, the driver circuit is also referred to as a BLI driver 110. Provided in the BLI control circuit 11C shown in FIGS. 8 and 9, the BLI driver 110 is a typical element functioning as a bit-line switch control circuit provided by the embodiment of the present invention.

The BLI driver 110 shown in FIG. 16 includes a delay unit 111, two negative-logic input and circuits NOR0 and NOR1, a nor circuit NOR2 and an inverter INV22. The delay unit 111 includes a predetermined number of buffers. Since the negative-logic input and circuits NOR0 and NOR1 are each equivalent to a nor circuit, the negative-logic input and circuits NOR0 and NOR1 are each denoted by reference symbol NOR.

The RWL enable signal RWLE is supplied to one of the input terminals of the nor circuit NOR0 by way of the delay unit 111. The output of the nor circuit NOR1 is connected to the other input terminal of the nor circuit NOR0. The pre-charge enable signal PRE is supplied to one of the input terminals of the nor circuit NOR1. The RBL isolation signal BLIR output by the nor circuit NOR0 is supplied to the other input terminal of the nor circuit NOR1.

The write enable signal WE is supplied to one of the input terminals of the nor circuit NOR2. The RBL isolation signal BLIR output by the nor circuit NOR0 is supplied to the other input terminal of the nor circuit NOR2. The output of the nor circuit NOR2 is supplied to the inverter INV22 for inverting the output of the nor circuit NOR2 in order to generate the WBL isolation signal BLIW.

<<Control of the Bit Line Isolation Signals>>

The following description explains the operation of the BLI driver 110 shown in FIG. 16. That is to say, the control of the bit line isolation signals is explained below by referring to timing charts shown in FIG. 17. In the following description, FIGS. 10, 13 and 16 are also referred to appropriately.

In the timing charts shown in FIG. 17, symbols Tpc, Tsb, Tr and Tw denote a pre-charge period, a standby period, a read period and a write period respectively. It is to be noted that FIG. 17 is an explanatory diagram referred to in describing combinations of a variety of signal levels during the four periods. In the actual operation, the order of the four periods is arbitrary.

As shown in FIG. 17A, during the pre-charge period Tpc, the pre-charge enable signal PRE is at an L level, keeping both the pre-charge transistors PTr and PTw employed in the pre-charge circuit 50 shown in FIG. 10 in an on state. During the pre-charge period Tpc, both the RBL isolation signal BLIR and the WBL isolation signal BLIW are at an H level while the Y switch signal YSW not shown in FIG. 17 is at an L level. Thus, the read bit line RBL, the write bit line WBL, the RBL sense line RBL_SA and the WBL sense line WBL_SA, which are shown in FIG. 10, are pre-charged in a state of being isolated from the global bit line pair GRBL-GWBL.

The standby period Tsb is a period starting at the rising-edge of the pre-charge enable signal PRE and ending at the rising edge of the RWL enable signal RWLE. The rising-edge of the pre-charge enable signal PRE is the transition of the pre-charge enable signal PRE from an L level to an H level for deactivation of the pre-charge enable signal PRE. The rising-edge of the RWL enable signal RWLE is the transition of the RWL enable signal RWLE from an L level to an H level for activation of the RWL enable signal RWLE.

As shown in FIG. 17B, during the pre-charge period Tpc and the standby period Tsb, the RWL enable signal RWLE is at an L level defined for an inactive state. As shown in FIG. 17C, during the pre-charge period Tpc, the standby period Tsb and the read period Tr, the write enable signal WE is at an L level defined for an inactive state.

During the pre-charge period Tpc and the standby period Tsb, one of the input terminals of the nor circuit NOR0 shown in FIG. 16 is at an L level. Thus, the RBL isolation signal BLIR output by the nor circuit NOR0 is at a H level as shown in FIG. 17D.

Since the RBL isolation signal BLIR set at a H level is supplied to one of the input terminals of the nor circuit NOR2 shown in FIG. 16, the nor circuit NOR2 outputs an L-level signal. Thus, the WBL isolation signal BLIW is at a H level as shown in FIG. 17E.

When the RWL enable signal RWLE is raised to an H level as shown in FIG. 17B, the read period Tr is started.

After a delay period Td determined by the delay unit 111 shown in FIG. 16 lapses since the beginning of the read period Tr, the output of the NR0 is inverted, pulling down the RBL isolation signal BLIR to an L level as shown in FIG. 17D. Thus, since both the inputs to the nor circuit NOR2 shown in FIG. 16 are at an L level, the output of the nor circuit NOR2 is inverted, pulling down the WBL isolation signal BLIW to an L level as shown in FIG. 17E. As a result, the BL switches 8ir and 8iw shown in FIG. 10 are turned off, electrically isolating the bit-line pair RBL-WBL from the sense-line pair RBL_SA-WBL_SA.

When the RWL enable signal RWLE is raised to an H level, the RWL activation signal RWLACT output by the inverter INV17 included in a row decoder unit 40 shown in FIG. 13 is also raised to an H level in order to put the signal in an active state. As a result, the electric potential of the read word line RWL output by the inverter INV19 included in the row decoder unit 40 is raised to an H level, entering an active state provided that the X_SEL has been set at a H level as a result of a process to decode the X-address bits X0 and X1 of an X signal. In this case, however, the read word line RWL activated as described above is a signal output by the row decoder unit 40 that has been selected as a result of a process to decode X-address bits included in the X signal as bits other than the X-address bits X0 and X1.

As a result, data stored in the storage node SN of a predetermined memory cell connected to the read word line RWL activated as described above is read out. It is to be noted that details of the operation to read out the data will be described later.

When the write enable signal WE is raised to an H level as shown in FIG. 17C in order to put the signal in an active state, the write period Tw is started.

At that time, the RWL enable signal RWLE has been pulled down to an L level in order to put the signal in an inactive state as shown in FIG. 17B. Thus, the RBL isolation signal BLIR shown in FIG. 16 has also been set at an L level. Since the write enable signal WE supplied to the nor circuit NOR2 is raised to an H level, however, the output of the nor circuit NOR2 is pulled down to an L level. Thus, the WBL isolation signal BLIW is raised to an H level in order to put the signal in an active state as shown in FIG. 17E.

Before the WBL isolation signal BLIW is put in an active state, the WBL isolation signal BLIW and the write enable signal WE are at an L level. Thus, the WWL activation signal WWLACT output by the inverter INV18 as shown in FIG. 13 is at an L level defined for an inactive state. As a result, the electric potential of the write word line WWL is at an L level defined for an inactive state.

When the write enable signal WE is activated and the WWL enable signal WWLE output by the control circuit 11 shown in FIG. 9 is also activated in the state described above, the output of the nand circuit NAND9 included in a row decoder unit 40 shown in FIG. 13 is inverted. Thus, the WWL activation signal WWLACT output by the inverter INV18 included in the row decoder unit 40 is also raised to an H level in order to put the signal in an active state. As a result, the electric potential of the write word line WWL output by the inverter INV20 included in the row decoder unit 40 is raised to an H level, entering an active state provided that the X_SEL has been set at a H level as a result of a process to decode the X-address bits X0 and X1 of an X signal. In this case, however, the write word line WWL activated as described above is a signal output by the row decoder unit 40 that has been selected as a result of a process to decode X-address bits included in the X signal as bits other than the X-address bits X0 and X1.

As a result, write data represented by a voltage set in advance on the write bit line WBL is stored into the storage node SN of a predetermined memory cell connected to the write word line WWL activated as described above. It is to be noted that details of the operation to write data will be described later.

Thereafter, when the pre-charge enable signal PRE is pulled down back to an L level in order to put the signal in an active state as shown in FIG. 17A, a pre-charge process is again carried out. In this state, both the inputs to the nor circuit NOR0 are at an L level, inverting the RBL isolation signal BLIR output by the nor circuit NOR0 to an H level as shown in FIG. 17D. Since the RBL isolation signal BLIR is at an H level as shown in FIG. 17D and the WBL isolation signal BLIW is also at an H level as shown in FIG. 17E, the BL switches 8ir and 8iw shown in FIG. 10 are both turned on, causing the voltage of the bit-line pair RBL-WBL to be pre-charged onto the sense-line pair RBL_SA-WBL_SA.

Thereafter, the state of the first pre-charge period Tpc is reestablished.

Next, operations to read out data from a memory cell are explained separately as two types of operation, i.e., an operation to read out H data and an operation to read out L data. The read operations are explained by taking the operations explained earlier by referring to FIG. 17 with reference to diagrams such as FIGS. 1, 10, 13, 14 and 16 as a premise. For this reason, the explanation of the control of the bit-line isolation signals and detailed operations of the circuits shown in FIGS. 10, 13 and 16 is not repeated in the following description in order to avoid duplication.

<<Operation to Read Out H Data>>

FIGS. 18A to 18L are timing charts of an operation to read out H data from the storage node SN shown in FIG. 1.

In FIG. 18, a time Tr0 is the start time of a read period Tr. In a period prior to the time Tr0, control explained earlier by referring to FIG. 17 as the control for a pre-charge period Tpc and a standby period Tsb is executed.

The read operation is explained below on the assumption that connection and disconnection between the bit-line pair RBL-WBL and the sense-line pair RBL_SA-WBL_SA (that is, junction and isolation between the bit-line pairs) are controlled by making use of only the two NMOS transistors serving as respectively the BL switches 8ir and 8iw employed in the BLI circuit 8 shown in FIG. 10.

A power-supply unit not referred to in the explanation of the circuits shown in FIGS. 8 and 10 boosts a pre-charge voltage to be applied to the RBL isolation signal BLIR and the WBL isolation signal BLIW in advance during the pre-charge period Tpc and the standby period Tsb as shown in FIGS. 18E and 18F respectively to a voltage of 3.0 V higher than the power-supply voltage Vdd of 1.8 V. That is to say, the voltage of 3.0 V is used as the high level of the RBL isolation signal BLIR and the WBL isolation signal BLIW. In this case, the threshold voltage of each of the two NMOS transistors serving as respectively the BL switches 8ir and 8iw employed in the BLI circuit 8 shown in FIG. 10 is assumed to be 0.5 V. By applying the voltage of at the high level of 3.0 V to the gates of the two NMOS transistors, the two NMOS transistors are completely turned on, electrically connecting the bit-line pair RBL-WBL to the sense-line pair RBL_SA-WBL_SA.

In addition, during the pre-charge period Tpc with the pre-charge enable signal PRE set at an L level as shown in FIG. 18J, the read bit line RBL is pre-charged in advance at a voltage VRBL typically equal to the power-supply voltage Vdd of 1.8 V whereas the write bit line WBL is pre-charged in advance at a voltage VWBL of typically 1.4 V, which is lower than the voltage VRBL. At that time, the RBL isolation signal BLIR and the WBL since the voltage appearing on the select transistor ST is at an H level, the amplification transistor AT is also turned on. Thus, the voltage of 1.8 V appearing on the read bit line RBL is discharged through the select transistor ST and the amplification transistor AT, which have been turned on, decreasing to a level lower than the voltage of 1.4 V appearing on the write bit line WBL.

The reversal of the relation between the voltage appearing on the read bit line RBL and the voltage of 1.4 V appearing on the write bit line WBL goes on to a time Tr1 at which the WBL isolation signal BLIW shown in FIG. 18E and the RBL isolation signal BLIR shown in FIG. 18F are pulled down to a voltage having an L level of 0 V after the lapse of the delay time Td generated by the delay unit 111 shown in FIG. 16. In other words, the delay time Td generated by the delay unit 111 shown in FIG. 16 is set at such a value that the reversal of the relation between the voltage appearing on the read bit line RBL and the voltage of 1.4 V appearing on the write bit line WBL results in a sufficient electric-potential difference allowing a read operation to be carried out.

As the WBL isolation signal BLIW shown in FIG. 18E and the RBL isolation signal BLIR shown in FIG. 18F are pulled down to a voltage having an L level of 0 V at the time Tr1, with this timing, loads are detached from the write bit line WBL and the read bit line RBL, which are shown in FIG. 10. The loads are the wiring load of the RBL sense line RBL_SA, the wiring load of the WBL sense line WBL_SA and the load of the sense amplifier SA. Thus, the electric-potential difference resulting from the reversal of the relation between the voltage appearing on the read bit line RBL and the voltage of 1.4 V appearing on the write bit line WBL no longer changes the difference in electric potential between the RBL sense line RBL_SA and the WBL sense line WBL_SA as shown in FIG. 18K.

Then, at a time Tr2 lagging behind the time Tr1, the SA enable signal SAEN and the SA enable inverted signal /SAEP, which are applied to the sense amplifier SA shown in FIG. 10, are activated in order to put the sense amplifier SA in an operative state. With the sense amplifier SA operating, the difference in electric potential between the RBL sense line RBL_SA and the WBL sense line WBL_SA is amplified to a magnitude equal to the difference between the power-supply voltage Vdd and the ground voltage as shown in FIG. 18K.

Then, with a timing corresponding to a time Tr3, the Y switch signal YSW is raised to an H level in order to activate the signal as shown in FIG. 18I. The time Tr3 is a time at which the difference in electric potential between the RBL sense line RBL_SA and the WBL sense line WBL_SA has been amplified to reach a sufficient magnitude. Thus, the NMOS switch transistors 61r and 61w shown in FIG. 10 are turned on, propagating read data to the global read bit line GRBL and the global write bit line GWBL are output.

The amplifier circuit 6C shown in FIG. 15 is connected to the global bit line pair GRBL-GWBL.

Since the pre-charge enable signal PRE is at an L level defined for an active state during the pre-charge period Tpc as shown in FIG. 18A, the PMOS transistors 65r and 65w shown in FIG. 15 are both turned on, pre-charging the global bit line pair GRBL-GWBL to the power-supply voltage Vdd of 1.8 V. The global bit line pair GRBL-GWBL is kept in the state of being pre-charged to the power-supply voltage Vdd of 1.8 V till the time Tr3 at which the Y switch signal YSW is raised to an H level in order to activate the signal as shown in FIG. 18I.

At the time Tr3, the global bit line pair GRBL-GWBL is connected to the sense-line pair RBL_SA-WBL_SA. Thus, the electric potential pre-charged on the global read bit line GRBL connected to the RBL sense line RBL_SA is discharged, starting to decrease from the level of 1.8 V. Due to electric-charge distribution according to load capacitances, however, the discharged electric potential of the global read bit line GRBL does not attain the ground level.

Then, the main-amplifier enable signal MAE is raised to an H level in order to activate the signal, putting the amplifier circuit 6C in an operating state. It is to be noted that this operation is not shown specially in FIG. 18. With the current mirror type amplifier circuit 6C put in an operating state, a difference in electric potential between the global read bit line GRBL and the global write bit line GWBL is amplified to a magnitude equal to a signal having an amplitude equal to the power-supply voltage Vdd. This signal obtained as a result of the amplification as a signal representing data read out from the memory cell is output by the amplifier circuit 6C as an output signal Vo to a circuit provided at a later stage. That is to say, the data read out from the memory cell is supplied from the column circuit 6 shown in FIG. 8 to an external recipient by way of the input/output buffer 9.

<<Read Out L Data>>

FIGS. 19A to 19L are timing charts of an operation to read out L data from the storage node SN shown in FIG. 1. The following description explains only differences from the operation explained above as an operation to read out H data from the storage node SN.

The basic control is the same as the operation to read out H data from the storage node SN. The bit-line pair RBL-WBL and the sense-line pair RBL_SA-WBL_SA are each pre-charged to the VRBL of 1.8 V and the VWBL of 1.4 V while the global bit line pair GRBL-GWBL is pre-charged to the power-supply voltage Vdd of 1.8 V. In addition, at the time Tr0, the read word line RWL is raised to an H level and, after the lapse of the delay time Td, the RBL isolation signal BLIR and the WBL isolation signal BLIW are pulled down to an L level in the same way as the operation to read out H data from the storage node SN.

In the case of the operation to read out L data from the storage node SN, however, the amplification transistor AT shown in FIG. 1 is not turned on. Thus, even if the read word line RWL is raised to an H level at the time Tr0, the read bit line RBL does not experience a discharging process. As a result, the voltage appearing on the read bit line RBL and the voltage appearing on the RBL sense line RBL_SA remain at the power-supply voltage Vdd as they are as shown FIGS. 19J and 19K respectively.

Then, at the time Tr1, the RBL isolation signal BLIR and the WBL isolation signal BLIW are pulled down to an L level and, subsequently, at the time Tr2, the sense amplifier SA is put in an active state. Thus, the voltage of the sense-line pair RBL_SA-WBL_SA is amplified, that is, the voltage appearing on the WBL sense line WBL_SA with its WBL (write bit line)-side load detached is pulled down from 1.4 V to the ground level.

Thereafter, the Y switch signal YSW is activated to put the amplifier circuit 6C shown in FIG. 15 in an operating state to carry out a read operation in the same way as the operation to read out H data from the storage node SN.

In the operation to read out L or H data as described above, in a sensing process carried out during a period of time between the times Tr2 and Tr3, loads seen from the sense amplifier SA are electrically detached from the sense-line pair RBL_SA-WBL_SA by the BLI circuit 8. The detached loads are the wiring load of the read bit line RBL, the wiring load of the write bit line WBL and the loads of the N memory cells MCa. Thus, the sense amplifier SA is capable of carrying out a sensing operation at a high speed.

In addition, since the electric potentials of the read bit line RBL and the write bit line WBL are not amplified, the amount of power consumed by the sense amplifier SA is small.

On the top of that, the period of time during which the electric potentials of the input nodes of the sense amplifier SA are equal to the power-supply voltage Vdd and the ground voltage in the sensing operation carried out at a high speed is short. Thus, the magnitudes of currents flowing through the inverters employed in the sense amplifier SA as inventers each including a PMOS transistor 21 and an NMOS transistor 22 can be reduced, hence, also allowing the power consumption of the sense amplifier SA to be decreased.

<<Operation to Write Data>>

Next, an operation to write data into a memory cell is explained.

Data to be written into a memory cell can be H data raising the voltage appearing on the storage node SN shown in FIG. 1 to a high level or L data pulling down the voltage appearing on the storage node SN to a low level.

FIGS. 20A to 20M show timing charts of a typical operation to write L data into the storage node SN of a memory cell whereas FIGS. 21A to 21M show timing charts of a typical operation to write H data into the storage node SN of a memory cell. In accordance with the timing charts of each of the typical operations, data stored in the memory cell is read out from the memory cell, a voltage appearing on the write bit line WBL to represent the read data is then inverted in order to set new data to be written and, finally, the new data is written into the memory cell.

In the read operations shown in FIGS. 18 and 19, the write enable signal WE is sustained at an L level defined for an inactive state during the read period Tr.

In the write operations, on the other hand, before the Y switch signal YSW shown in FIGS. 20I and 21I is raised to an H level, the write enable signal WE is raised to an H level at a time Tw0 as shown in FIGS. 20C and 21C in order to start a write period Tw.

In either of the write operations shown in FIGS. 20 and 21, prior to the write period Tw, it is necessary to carry out the pre-charge and read-before write processes described above and set a voltage demanded for a refresh process on the global write bit line GWBL in advance for a reason described as follows.

FIG. 10 shows a configuration including only a column of memory cells included in an array of memory cells and a control circuit for the column of memory cells. In the following description, such a column is referred to as a column unit.

In an actual semiconductor memory, however, a plurality of such column units having the same configuration are arranged in the row direction to form an array of memory cells. Memory cells on the same row in the array share a common write word line WWL and a common read word line RWL.

In a random access to such a semiconductor memory, for example, data is written into a predetermined number of memory cells on the same row. These memory cells form a write unit, which is typically referred to as a byte having a size of 8 bits. In this write operation, write data is set on the global write bit line GWBL in each column unit subjected to the write operation and the Y switch signal YSW is put in an active state in order to forcibly update the electric potential of the write bit line WBL to an electric potential determined by the write data.

As for a column unit not subjected to the write operation, a refresh operation is carried out.

That is to say, when data is read out from a memory cell, a voltage is output to the read bit line RBL to represent data obtained by logically inversion of the data stored in the memory cell as shown in FIGS. 18J and 19J. Thus, in this read-before-write process, such a voltage has to naturally be set on the write bit line WBL that a refresh voltage representing the logic of the data stored in the memory cell is represented by the voltage output to the read bit line RBL and the voltage set on the write bit line WBL. In the case of the read operations shown in FIGS. 3 and 4, such a voltage is set on the write bit line WBL.

In the case of this embodiment, however, the bit-line pair RBL-WBL is detached from the sense-line pair RBL_SA-WBL_SA during a read operation. Thus, the write bit line WBL is sustained at a voltage of 1.4 V as shown in FIGS. 18J and 19J, providing a refresh voltage unrelated to the logic of the data stored in the memory cell. As a result, with the write bit line WBL sustained at a voltage of 1.4 V, a refresh process may not be carried out.

In the case of the embodiment, a read process also referred to as a read-before-write process is carried out before a write process in a write operation. Thus, in order to solve the problem described above, in a column unit not subjected to the write operation, it is necessary to set a refresh voltage for a refresh process in advance on the global write bit line GWBL. Then, only in a column unit subjected to the write operation, it is necessary to forcibly replace the refresh voltage with a voltage representing data received from an external source as data to be written into the memory cell.

The relation between voltages set on the read bit line RBL and the write bit line WBL for the L-data write operation shown in FIG. 20 is opposite to the relation between voltages set on the read bit line RBL and the write bit line WBL for the H-data write operation shown in FIG. 21. Accordingly, such voltages have to be set on the global read bit line GRBL and the global write bit line GWBL that the relation between voltages set on the global read bit line GRBL and the global write bit line GWBL for the L-data write operation shown in FIG. 20 is opposite to the relation between voltages set on the read bit line RBL and the write bit line WBL for the H-data write operation shown in FIG. 21.

To put it concretely, in the case of the L-data write operation shown in FIG. 20, a voltage of 1.8 V is asserted on the global read bit line GRBL as shown in FIG. 20J while a voltage of 0 V is asserted on the global write bit line GWBL as shown in FIG. 20K.

On the other hand, in the case of the H-data write operation shown in FIG. 21, a voltage of 0 V is asserted on the global read bit line GRBL as shown in FIG. 21J while a voltage of 1.8 V is asserted on the global write bit line GWBL as shown in FIG. 21K.

The read processes ending at the time Tr2 as shown in FIGS. 20 and 21 are identical with the read operations explained earlier by referring to FIGS. 18 and 19 respectively. For this reason, the explanation of the processes shown in FIGS. 20 and 21 is not repeated in order to avoid duplication. In the following description, the read processes shown in FIGS. 20 and 21 are each also referred to as a read-before-write process.

With a timing corresponding to a time Tw0, the write enable signal WE is raised to an H level as shown in FIGS. 20C and 21C in order to put the signal in an active state. At the time Tw0, a voltage difference detected in a process starting at the time Tr2 in the read-before-write process as a difference in voltage between the RBL sense line RBL_SA and the WBL sense line WBL_SA becomes sufficiently large.

When the write enable signal WE is raised to an H level at the time Tw0, the WBL isolation signal BLIW is also raised to an H level as shown in FIGS. 20E and 21E as a result of a circuit operation explained earlier by referring to FIG. 17. Thus, the write bit line WBL is electrically connected to the WBL sense line WBL_SA. Since the RBL isolation signal BLIR is sustained at an L level as it is at the time Tw0 as shown in FIGS. 20F and 21F, however, the read bit line RBL remains electrically disconnected from the RBL sense line RBL_SA as it is.

At a time Tw1 lagging behind the time Tw0, the YSW gate circuit 60 shown in FIG. 14 puts the Y switch signal YSW in an active state. Thus, the relation between the voltage appearing on the read bit line RBL and the voltage appearing on the write bit line WBL as well as the relation between the voltage appearing on the RBL sense line RBL_SA and the voltage appearing on the WBL sense line WBL_SA electrically connected to the write bit line WBL in a column unit selected as a unit subjected to the write operation are reversed.

In the above process to reverse the voltage relations, the voltage appearing on the RBL sense line RBL_SA is inverted at a high inversion speed because the RBL sense line RBL_SA is electrically disconnected from the read bit line RBL serving as a load on the memory-cell side. In addition, since the magnitude of the signal appearing on the read bit line RBL does not change, the amount of power consumed by the amplifier circuit 6C can be reduced by a quantity caused by the unchanged state of the magnitude of the signal appearing on the read bit line RBL. The high speed of the process to invert the voltage appearing on the RBL sense line RBL_SA means that a period in which the input to the sense amplifier SA is at an intermediate voltage level is short. Thus, the magnitude of a penetration current, which is flowing while the sense amplifier SA is carrying out the voltage inversion process, is also small, resulting in a small power consumption. The intermediate voltage level is a level between the ground voltage and the power-supply voltage Vdd.

On the other hand, the above process to reverse the voltage relations is carried out with the write bit line WBL electrically connected to the WBL sense line WBL_SA. Thus, there is no effect of power-consumption reduction that would be resulted in due to detachment of a load.

It is to be noted that in the case of the L-data write operation shown in FIG. 20, the voltage appearing on the write bit line WBL decreases from a level slightly higher than 1.4 V to the ground level of 0 V as shown in FIG. 20L whereas the voltage appearing on the WBL sense line WBL_SA decreases from a level slightly lower than 1.8 V to the ground level of 0 V as shown in FIG. 20M. In the case of the H-data write operation shown in FIG. 21, on the other hand, the voltage appearing on the write bit line WBL increases from a level slightly lower than 1.4 V to the high level of 1.8 V as shown in FIG. 21L whereas the voltage appearing on the WBL sense line WBL_SA increases from a level slightly higher than 0 V to the high level of 1.8 V as shown in FIG. 21M.

Thus, in the case of this embodiment, the load borne by the sense amplifier SA becomes small to a certain degree in comparison with the voltage inversion process to fully increase a voltage from 0 V to 1.8 V over the entire range and fully decrease a voltage from 1.8 V to 0 V over the entire range. As a result, the embodiment offers merits that it is possible to reduce the power consumption of the amplifier circuit 6C, increase the speed of the voltage inversion process carried out by the amplifier circuit 6C and decrease the magnitude of a penetration current, which is flowing through the sense amplifier SA while the sense amplifier SA is carrying out the voltage inversion process, due to the high speed to mention a few.

It is to be noted that, also in an unselected column unit including no memory cells subjected to the write operation, with the timing of the time Tw1, the Y switch signal YSW is raised to a high level as shown in FIGS. 20I and 21I in order to set a voltage representing data to be written on the write bit line WBL held at an intermediate voltage of 1.4 V in the unselected column unit connected to the write bit line WBL as described earlier. In the case of an unselected column unit, the voltage representing data to be written is the refresh voltage, which corresponds to the voltage representing the data read out in the read-before-write process.

In this way, in an unselected column unit, the refresh voltage set on the global write bit line GWBL is propagated to the write bit line WBL.

Next, with a timing corresponding to a time Tw2, the write word line WWL is raised to a high level as shown in FIGS. 20C and 21C in order to put the signal in an active state. The time Tw2 is a time at which the process to reverse the voltage relations as described above is completely ended. With the write word line WWL put in an active state, in a memory cell employed in a selected column unit as a cell connected to the write word line WWL, the write transistor WT shown in FIG. 1 is turned on, storing the L or H write data forcibly set on the write bit line WBL into the storage node SN.

At that time, in a memory cell employed in an unselected column unit as a cell connected to the write word line WWL put in an active state as described above, the voltage representing data stored originally in the storage node SN of the memory cell has been set on the write bit line WBL and thus written again into the storage node SN in a write process referred to as a refresh process. The voltage set on the write bit line WBL to represent data stored in the memory cell is either the power-supply voltage Vdd, which is the upper limit of the voltage range or 0 V, which is the lower limit of the voltage range.

Next, variations of the embodiment are described.

<<Modification of the BLI Circuit>>

FIGS. 8 and 10 each show a typical configuration including the BLI circuit 8 in which only an NMOS transistor functions as each of the BL switches 8*ir* and 8*iw* for electrically isolating the bit-line pair RBL-WBL and the sense-line pair RBL_SA-WBL_SA from each other.

Figure 22:
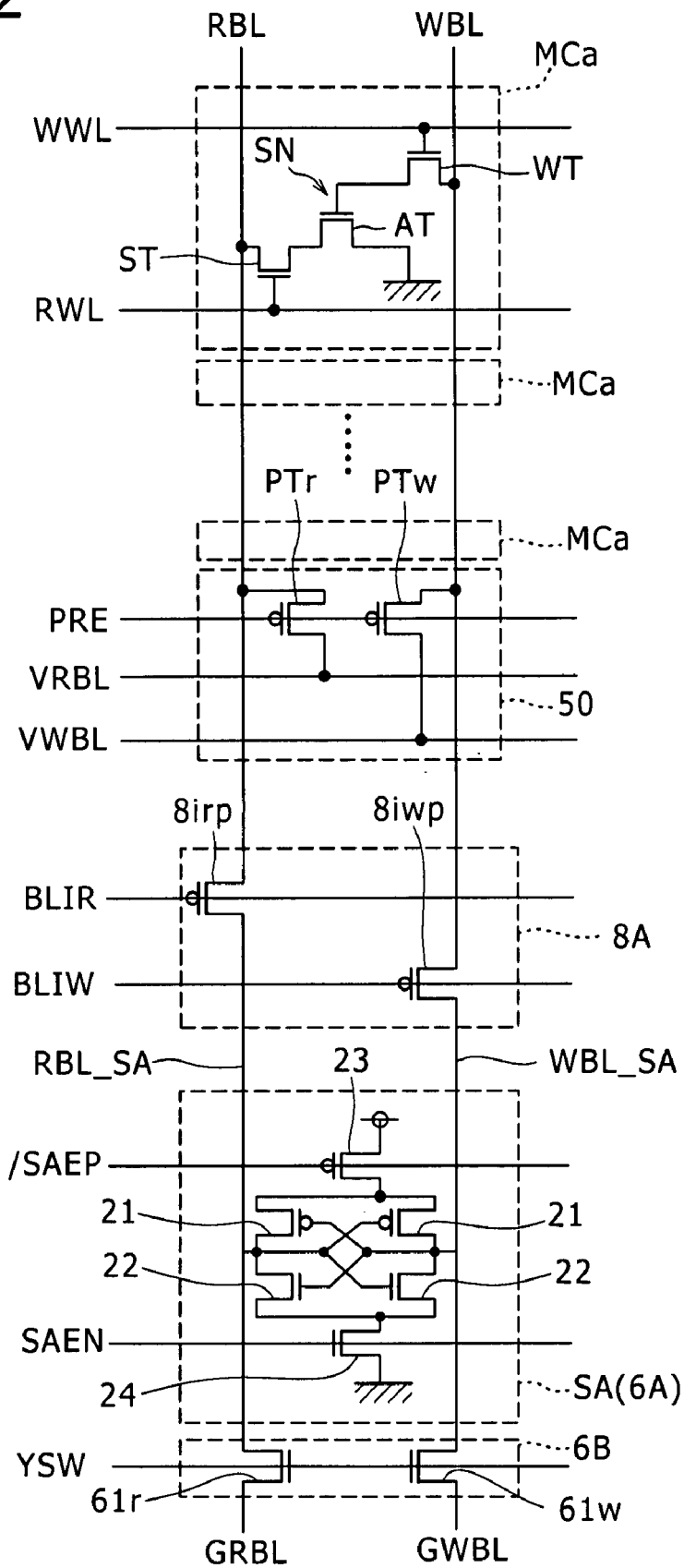
FIG. 22 is a diagram showing the circuit of a column unit employing a typical modified BLI circuit.
Figure 23:
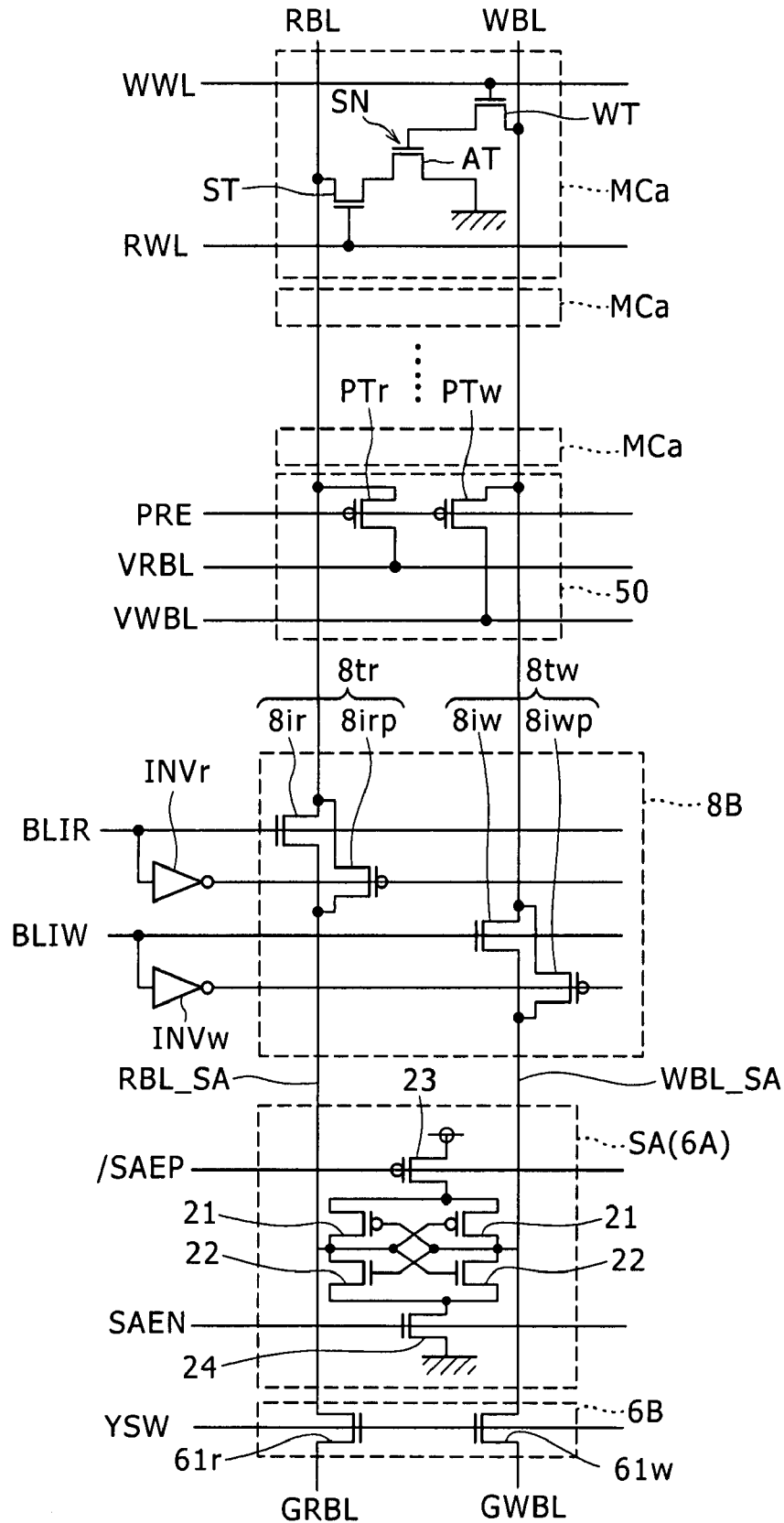
FIG. 23 is a diagram showing the circuit of a column unit employing another typical modified BLI circuit.

In place of the column units each including the BLI circuit 8 as shown in FIGS. 8 and 10, a column unit shown in FIG. 22 or 23 can be adopted.

A BLI circuit 8A included in the column unit shown in FIG. 22 has a PMOS transistor functioning as a BL switch 8*irp* and a PMOS transistor functioning as a BL switch 8*iwp*. The BL switch 8*irp* is provided between the read bit line RBL and the RBL sense line RBL_SA whereas the BL switch 8*iwp* is provided between the write bit line WBL and the WBL sense line WBL_SA.

In a configuration with PMOS transistors each serving as a BL switch as described above, signals each having inverted logic of the RBL isolation signal BLIR and the WBL isolation signal BLIW, which are used in the configuration with NMOS transistors each serving as a BL switch as described earlier, are used for turning on and off the PMOS transistors. To be more specific, an RBL isolation inverted signal /BLIR is supplied to the gate of the PMOS transistor serving as the BL switch 8*irp* while a WBL isolation inverted signal /BLIW is supplied to the gate of the PMOS transistor serving as the BL switch 8*iwp*.

The BLI control circuit 11C shown in FIGS. 8 and 9 is redesigned to generate the RBL isolation inverted signal /BLIR and the WBL isolation inverted signal /BLIW. In this case, in the BLI driver 110 shown in FIG. 16 as a driver employed in the BLI control circuit 11C, the inverter INV22 is typically provided on the BLIW-side output of the BLI driver 110 instead of being provided on the BLIR-side output of the BLI driver 110.

A BLI circuit 8B included in the column unit shown in FIG. 23 includes the BL switches each having a transfer gate configuration.

To be more specific, the BLI circuit 8B has a BL switch 8*tr* including an NMOS transistor serving as the BL switch 8*ir* and a PMOS transistor connected in parallel to the NMOS transistor as a PMOS transistor serving as the BL switch 8*irp*. In addition, the BLI circuit 8B has a BL switch 8*tw* including an NMOS transistor serving as the BL switch 8*iw* and a PMOS transistor connected in parallel to the NMOS transistor as a PMOS transistor serving as the BL switch 8*iwp*.

The BL switch 8*ir* is controlled by the RBL isolation signal BLIR while the BL switch 8*irp* is controlled the RBL isolation inverted signal /BLIR output by an inverter INVr as a signal obtained by inverting the RBL isolation signal BLIR. By the same token, the BL switch 8*iw* is controlled by the WBL isolation signal BLIW while the BL switch 8*iwp* is controlled the WBL isolation inverted signal /BLIW output by an inverter INVw as a signal obtained by inverting the RBL isolation signal BLIW.

The inverters INVr and INVw can be provided in close proximity to the column unit as shown in FIG. 23. As an alternative, the inverters INVr and INVw can be provided inside the BLI driver 110 employed in the BLI control circuit 11C to generate the four signals, i.e. the RBL isolation signal BLIR, the RBL isolation inverted signal /BLIR, the WBL isolation signal BLIW and the WBL isolation inverted signal /BLIW.

In a configuration with only the NMOS transistor or the PMOS transistor used as a BL switch, the upper limits of the voltages appearing on the read bit line RBL and the write bit line WBL are each a voltage lower than the gate voltage supplied to the gate of the NMOS or PMOS transistor serving as the BL switch by the threshold voltage Vth of the transistor. It is thus necessary to increase or decrease an activation voltage for the RBL isolation signal BLIR and the WBL isolation signal BLIW in the read operation.

In a configuration with a transfer gate used as a BL switch such as the one shown in FIG. 23, on the other hand, the configuration has a demerit that the number of components employed in each BL switch increases and a demerit that the number of wiring areas increases due to the fact that it is necessary to treat the RBL isolation signal BLIR and the WBL isolation signal BLIW as a complementary signal. However, it is not necessary to increase the voltage level of the activation signals for the RBL isolation signal BLIR and the WBL isolation signal BLIW. Thus, the modified embodiment has a merit of a simplified configuration of the peripheral circuit.

<<Modification of the SA Reference Voltage Generation in a Read Operation>>

Different pre-charge voltages are generated in the read operation method shown in FIGS. 3 to 6, and the different pre-charge voltages are supplied to the write bit line WBL and the read bit line RBL. The pre-charge voltage of the write bit line WBL is 1.4 V which is lower than a pre-charge voltage of 1.8 V for the read bit line RBL. The 1.4V pre-charge voltage of the write bit line WBL is used as a reference voltage in the sensing operation of the sense amplifier SA. As shown in FIGS. 5J and 6J, for example, the voltage sensing process is carried out by sensing changes in the voltage appearing on the read bit line RBL with the voltage on the read bit line RBL taken as a reference.

However, the embodiment is by no means limited to such a voltage sensing method. For example, the embodiment can be modified to the following configuration for carrying on out operations described below.

Figure 24:
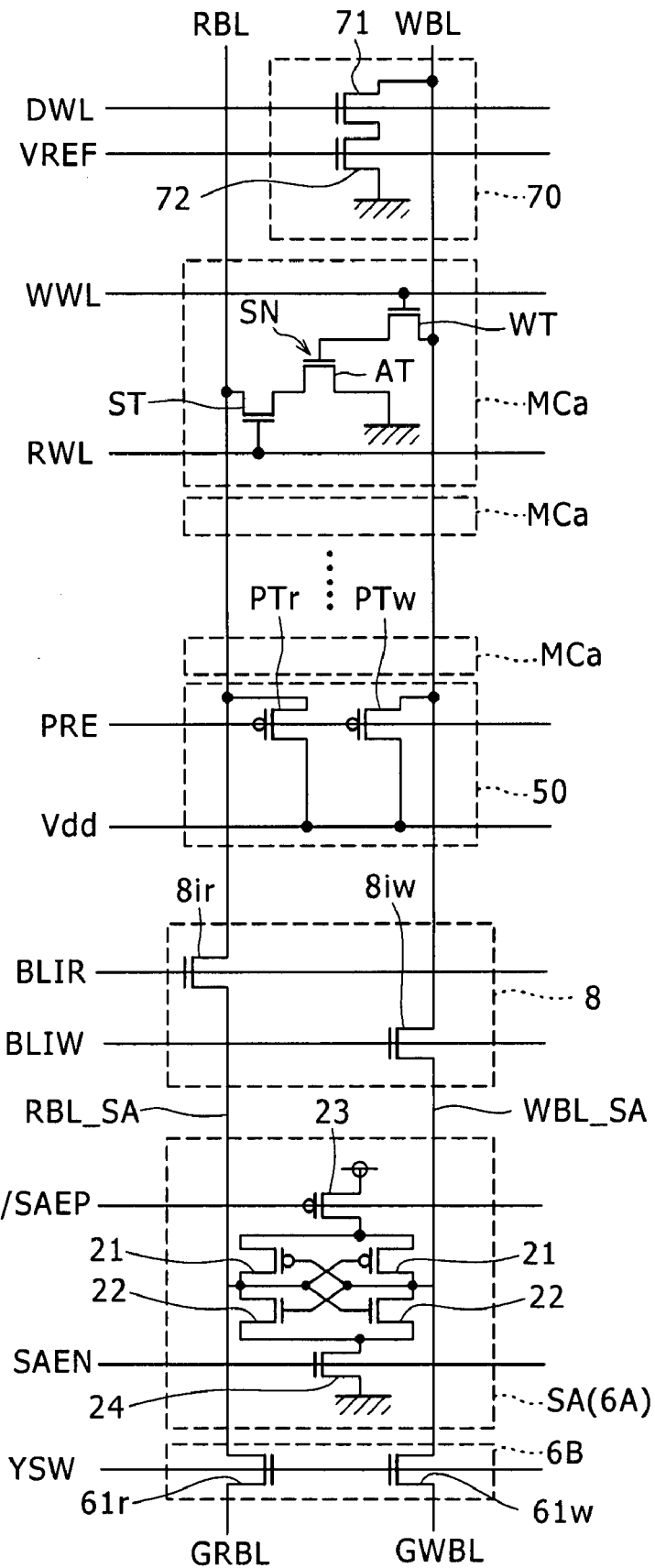
FIG. 24 is a diagram showing another configuration of a column unit.

FIG. 24 is a diagram showing the configuration of a column unit according to the modified embodiment.

The embodiment described earlier by referring to FIG. 10 has a pre-charge circuit 50 for generating different pre-charge voltages, and supplying the different pre-charge voltages to the write bit line WBL and the read bit line RBL. In the case of the embodiment shown in FIG. 24, on the other hand, a pre-charge circuit 50A is provided to function as a pre-charger pre-charging the same voltage typically equal to the power-supply voltage Vdd of 1.8V as a voltage obtained from an equalizing process onto the read bit line RBL and the write bit line WBL.

In the pre-charge circuit 50A shown in FIG. 24, the sources of the pre-charge transistor PTr and the pre-charge transistor PTw are connected to a common line for supplying the power-supply voltage Vdd.

In addition, in the configuration shown in FIG. 24, the write bit line WBL is connected to a reference-voltage circuit 70, which is not included in the configuration shown in FIG. 10.

Provided with two NMOS transistors 71 and 72, the reference-voltage circuit 70 is a circuit capable of setting a proper voltage on the write bit line WBL in a voltage sensing process carried out by the sense amplifier SA for a process to read L or H data.

The two NMOS transistors 71 and 72 are connected in series between the write bit line WBL and a line for providing the ground voltage. The gate of the NMOS transistor 71 is connected to another reference word line DWL for determining a timing of a reference-voltage change. On the other hand, the gate of the NMOS transistor 72 is connected to a line for supplying a reference-level control voltage VREF.

A circuit for controlling the reference word line DWL and the reference-level control voltage VREF is typically provided in the row decoder 4 shown in FIGS. 8 and 9.

The level of the reference-level control voltage VREF can be changed. A variation in the level of the reference-level control voltage VREF changes the bias state of the NMOS transistor 72. The NMOS transistor 72 is a transistor functioning as a discharge resistor for determining the discharge speed of the write bit line WBL in a discharge process from the power-supply voltage Vdd during a voltage sensing process carried out as a read operation. To put it in detail, if the level of the reference-level control voltage VREF is raised, the on resistance of the NMOS transistor 72 decreases, hence, increasing the discharge speed. If the level of the reference-level control voltage VREF is reduced, on the other hand, the on resistance of the NMOS transistor 72 increases, hence, decreasing the discharge speed.

By changing the magnitude of the reference-level control voltage VREF, the discharge speed can be optimized to value for obtaining a sufficiently large read margin for both the operation to read out data at an H level and the operation to read out data at an L level.

FIGS. 25A to 25M show timing charts for an operation to read out H data. FIGS. 26A to 26N show timing charts for an H-data write operation including a read-before-write process to read out L data and a write process carried out after the read-before-write process as a write process to write inverted data of the L data.

It is to be noted that, in the following description, the explanation of control common to the read operation or the read-before-write process, which have been described before, is not repeated in order to avoid duplications. Thus, processes peculiar to this modified embodiment are explained.

Figure 25:
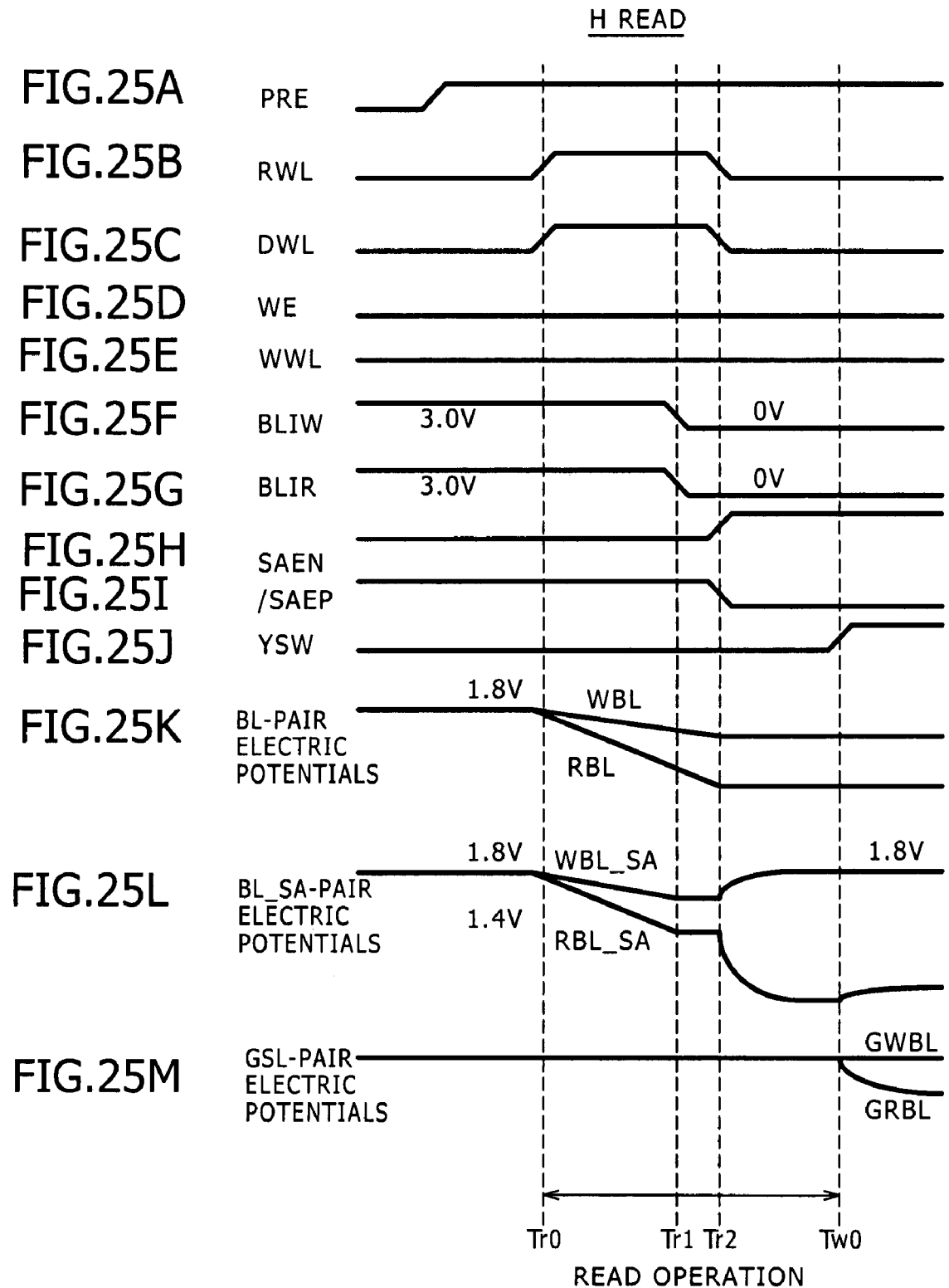
FIGS. 25A to 25M show timing charts for an operation to read out H data in the configuration shown in FIG. 24.
Figure 26:
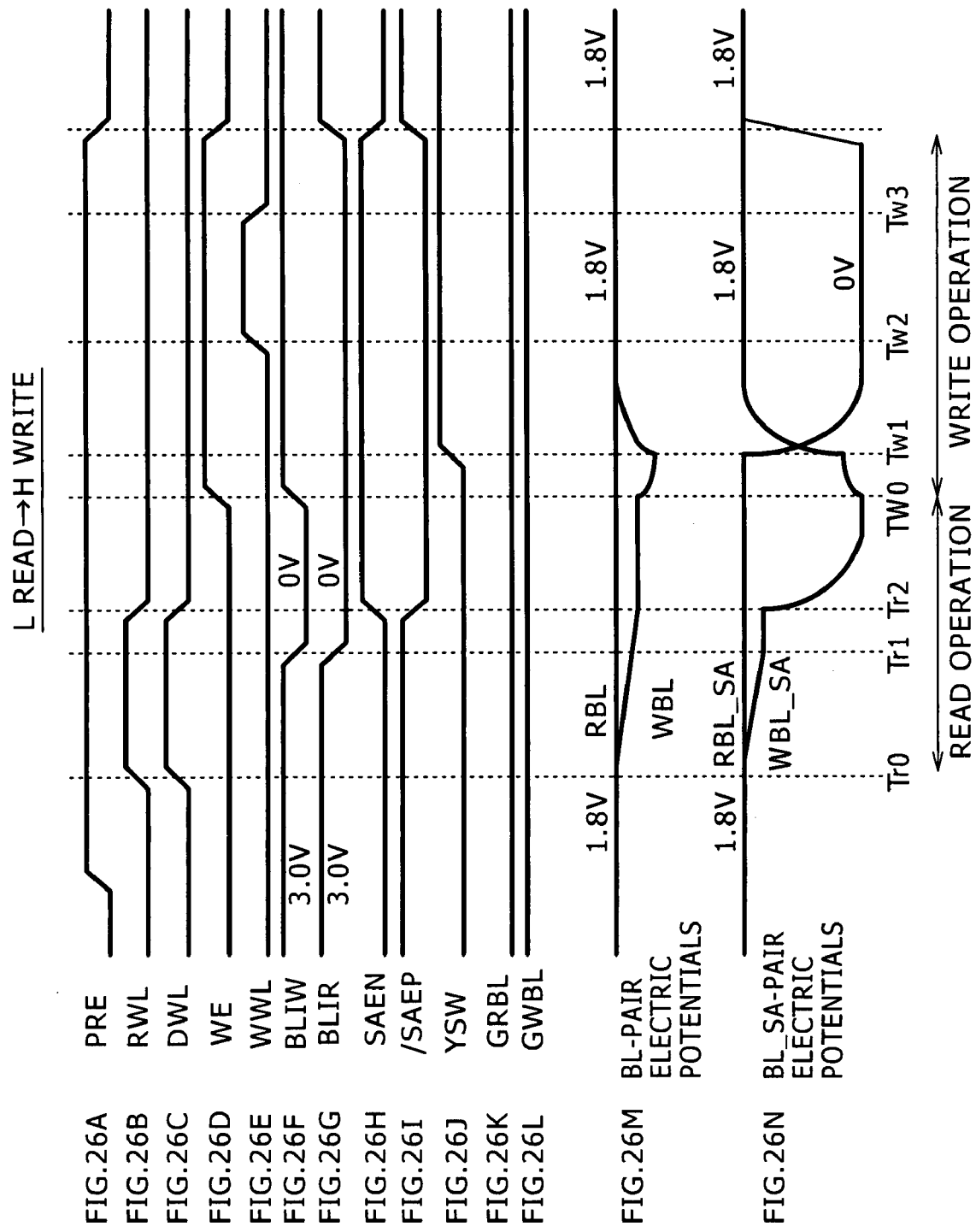
FIGS. 26A to 26N show timing charts for an operation to write H data in the configuration shown in FIG. 24.

As shown in FIGS. 25C and 26C, the reference word line DWL shown in FIG. 24 is raised and pulled down with about the same timings as the read word line RWL shown in FIGS. 25B and 26B respectively.

When the reference word line DWL is raised at a time Tr0, the NMOS transistor 71 shown in FIG. 24 is turned on, forming a discharge path including the on resistor of the NMOS transistor 72 for the write bit line WBL. Thus, the write bit line WBL discharges at a constant speed at a constant slope as shown in FIGS. 25K and 26M, causing the voltage appearing on the write bit line WBL to go down as indicated by a downward-inclining voltage appearing on the write bit line WBL. At that time, since the BL switch 8iw shown in FIG. 24 is in an on state, the voltages appearing on the sense-line pair RBL_SA-WBL_SA are also decreasing at a constant voltage as shown in FIGS. 25L and 26N.

The discharge speeds of the sense-line pair RBL_SA-WBL_SA (that is, the downward slope of the voltage drops) are determined in such a following way. When the sense amplifier SA is put in an active state at a time Tr2, the electric potential appearing on the WBL sense line WBL_SA has become higher than the electric potential appearing on the RBL sense line RBL_SA in the read-before-write process to read out H data as shown in FIG. 25L but lower than the electric potential appearing on the RBL sense line RBL_SA in the read-before-write process to read out L data as shown in FIG. 26N. It is desirable to set the discharge speeds (that is, the downward slope of the voltage drops) of the sense-line pair RBL_SA-WBL_SA at such following values. The values that the absolute value of an electric-potential difference ΔVr between the WBL sense line WBL_SA and the RBL sense line RBL_SA at the time Tr2 in the read-before-write process to read out H data is about the same as the absolute value of an electric-potential difference ΔVw between the WBL sense line WBL_SA and the RBL sense line RBL_SA at the time Tr2 in the read-before-write process to read out L data.

In order to satisfy the condition described above, the value of the reference-level control voltage VREF shown in FIG. 24 as a quantity representing a discharge power is determine in accordance with loads borne by the bit-line pair RBL-WBL and the sense-line pair RBL_SA-WBL_SA, a period of time between the time Tr0 and the time Trn, a period of time between the time Tr0 and the time Tr2 and the driving power of the sense amplifier SA.

<<Layouts and Other Topics>>

Figure 27:
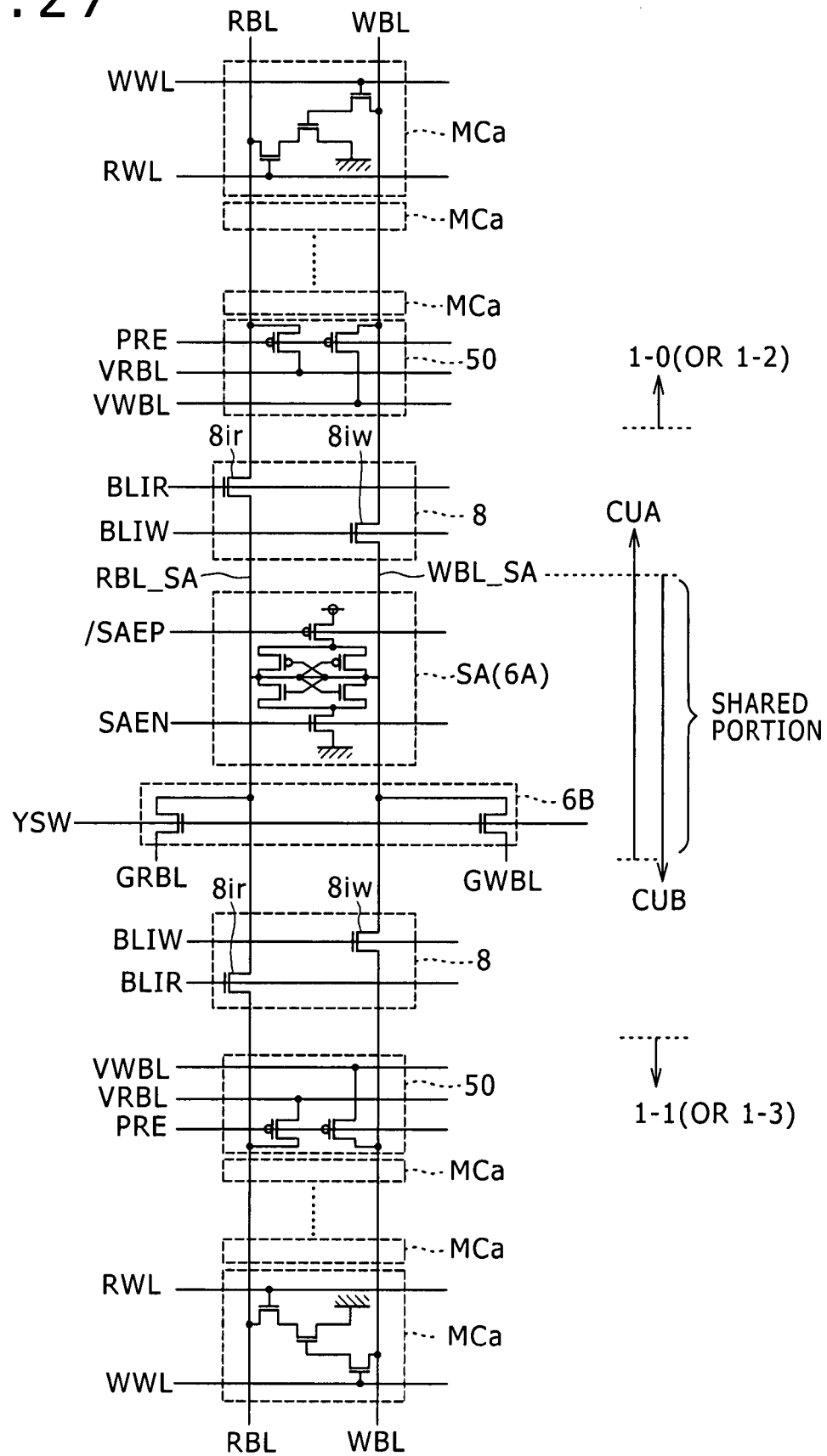
FIG. 27 is a diagram showing the circuit of a typical layout of two column units.

In the embodiments, a typical layout like one shown in FIG. 27 can be adopted.

In the typical layout shown in FIG. 27, the column circuit 6 including the sense amplifier SA and the BL selector 6B are shared by two column units CUA and CUB. For example, the layout shown in FIG. 27 can be applied to the configuration shown in FIG. 9 as follows. Cell-array blocks 1-0 and 1-1 are arranged in the column direction and a column circuit 6 is provided between the cell-array blocks 1-0 and 1-1 to be shared by the blocks. By the same token, cell-array blocks 1-2 and 1-3 are arranged in the column direction and a column circuit 6 is provided between the cell-array blocks 1-2 and 1-3 to be shared by the blocks.

By adopting the layout shown in FIG. 27, the area of the circuit layout can be reduced.

It is to be noted that the configuration of the memory cells provided by the present embodiment is by no means limited to the configuration shown in FIG. 1. A configuration in which data is read from a memory cell by amplifying the voltage appearing on the storage node SN of the memory cell is popular. In addition, in a process to read out data from the storage node SN, the high-level voltage appearing on the storage node SN is raised through a capacitor.

In accordance with the embodiment, by virtue of the operation of the BLI circuit 8, the voltage sensing period between the time Tr2 and the time Tr3 can be shortened as described in the last paragraph of the description of the operation to read data. Thus, the embodiment offers a merit that the voltage sensing process can be carried out at a high speed. As a result, the embodiment also offers another merit that the amount of power consumed by the sense amplifier SA can be reduced as well. The voltage sensing period between the time Tr2 and the time Tr3 corresponds to a period shown in FIGS. 5 and 6 as the voltage sensing period between the time T2 and the time T3. It is thus obvious from the figures that the voltage sensing period is shortened.

In addition, in accordance with the embodiment, the period between the times Tw1 and Tw2 in which a process is carried out to reverse the relations between voltages appearing on the bit-line pair RBL-WBL and between voltages appearing on the sense-line pair RBL_SA-WBL_SA is short as explained in a paragraph in the description of the operation to write data. Thus, the period in which the read-before-write process is carried out prior to the write process is also short. The short read-before-write process has a multiple effect of offering a merit that the length of the write cycle operation can be reduced. That is to say, the short length of the write cycle operation brings about another merit that the amount of power consumed by the amplifier circuit 6C and the sense amplifier SA can be decreased. The period between the times Tw1 and Tw2 in which a process is carried out to reverse the relations between voltages appearing on the bit-line pair RBL-WBL and between voltages appearing on the sense-line pair RBL_SA-WBL_SA corresponds to the period shown in FIGS. 5 and 6 as a period of time between the times T3 and T4. It is thus obvious from the figures that the period between the times Tw1 and Tw2 in which a process is carried out to reverse the relations between voltages appearing on the bit-line pair RBL-WBL and between voltages appearing on the sense-line pair RBL_SA-WBL_SA can also be shortened as well.

As explained in a paragraph in the description of the operation to write data, the amount of power consumed by the amplifier circuit 6C and the sense amplifier SA can be decreased also in a column unit including unselected memory cells arranged on the same row as a memory cell subjected to the data write operation.

As explained above, by applying the present embodiment, it is obvious that, in this embodiment, the amount of power consumed by the amplifier circuit 6C and the sense amplifier SA can be decreased and, at the same time, the operations of the amplifier circuit 6C and the sense amplifier SA can be carried out at a high speed.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor memory device comprising:
    a memory-cell array including memory cells laid out to form an array;
    a read bit line shared by a plurality of said specific memory cells arranged in one direction in said memory-cell array and connected to a data output node of each of said specific memory cells;
    a write bit line shared by a plurality of said specific memory cells and connected to a data input node of each of said specific memory cells;
    a sense amplifier configured to sense a difference in electric potential between said read bit line and said write bit line;
    a first sense line connected to one of said input terminals of said sense amplifier;
    a second sense line connected to the other input terminal of said sense amplifier;
    a first bit line switch configured to control electrical connection and disconnection between said first sense line and said read bit line; and
    a second bit line switch configured to control electrical connection and disconnection between said second sense line and said write bit line.

2. The semiconductor memory device according to claim 1, said semiconductor memory device further comprising
    a bit line switch control circuit configured to control the voltage of said first bit line switch and the voltage of said second bit line switch independently of each other.

3. The semiconductor memory device according to claim 1, said semiconductor memory device further comprising:
    a global read bit line;
    a global write bit line;
    a first column switch configured to control electrical connection and disconnection between said global read bit line and said first sense line;
    a second column switch configured to control electrical connection and disconnection between said global write bit line and said second sense line; and
    an amplifier circuit configured to amplify a difference in voltage between said global read bit line and said global write bit line.

4. The semiconductor memory device according to claim 1, wherein said sense amplifier is an amplifier of a cross-couple latch type.

5. The semiconductor memory device according to claim 1, wherein each of said memory cells comprises:
    a write transistor, a source or drain of which is connected to a storage node;
    a read transistor put in a conductive or nonconductive state in accordance with the electric potential of said storage node; and
    the drain of said read transistor is connected to a fixed-voltage line if said source of said write transistor is connected to said storage node, or said source of said read transistor is connected to said fixed-voltage line if said drain of said write transistor is connected to said storage node.

6. The semiconductor memory device according to claim 2, wherein said bit line switch control circuit is a circuit for executing control to change the states of said first bit line switch and said second bit line switch from an on or conductive state to an off or nonconductive state in an operation to read out data and turn on said second bit line switch only in an operation to write data.

7. The semiconductor memory device according to claim 6, wherein said bit line switch control circuit is a circuit for executing control to:
    put both said first bit line switch and said second bit line switch in an on state in advance till data is output to said read bit line and propagated to said first sense line;
    put both said first bit line switch and said second bit line switch in an off state prior to activation of said sense amplifier; and
    turn on only said second bit line switch in an operation to write data into a specific one of said memory cells after reading out data from said specific memory cell by inverting or not inverting output data generated by said activated sense amplifier as a result of amplifying the amplitude of a signal appearing between said first sense line and said second sense line to represent said data read out from said specific memory.

8. The semiconductor memory device according to claim 6, wherein said bit line switch control circuit is a circuit for controlling said first bit line switch and said second bit line switch to turn off said first bit line switch and said second bit line switch in a period of time other than the period of said operation to read out data and the period of said operation to write data.

9. An operation method for said semiconductor memory device having
    a memory-cell array including memory cells laid out to form an array,
    a read bit line shared by a plurality of said specific memory cells arranged in one direction in said memory-cell array and connected to a data output node of each of said specific memory cells,
    a write bit line shared by said specific memory cells and connected to a data input node of each of said specific memory cells, and
    a sense amplifier configured to sense a difference in electric potential between said read bit line and said write bit line, said operation method comprising the steps of:
    executing control to change the states of said read bit line and said write bit line from a state of being electrically connected to said sense amplifier to a state of being electrically disconnected from said sense amplifier in an operation to read out data; and
    electrically connecting said write bit line only to said sense amplifier in an operation to write data.

10. The operation method according to claim 9, said operation method further comprising the steps of:
    putting both said read bit line and said write bit line in a state of being electrically connected to said sense amplifier till data is output to said read bit line and propagated to one of said input terminals of said sense amplifier;
    putting both said read bit line and said write bit line in a state of being electrically disconnected from said sense amplifier prior to activation of said sense amplifier;
    letting said activated sense amplifier amplify the amplitude of a signal sensed between the input terminals of said sense amplifier as a signal representing a difference in electric potential between said read bit line and said write bit line; and putting only said write bit line in a state of being again electrically connected to said sense amplifier in an operation to write data into a specific one of said memory cells after reading out data from said specific memory cell by inverting or not inverting output data generated by said activated sense amplifier as a result of amplifying the amplitude of a signal appearing between said read bit line and said write bit line to represent said data read out from said specific memory.

11. The operation method according to claim 9, in a period of time other than the period of said operation to read out data and the period of said operation to write data, the state of being electrically disconnected from said sense amplifier is sustained as a state of both said read bit line and said write bit line.

* * * * *